United States Patent
Trout et al.

(12)

(10) Patent No.: US 6,485,321 B1
(45) Date of Patent: Nov. 26, 2002

(54) SOCKET FOR PIN GRID ARRAY PACKAGE

(75) Inventors: David Allison Trout, Wrightsville, PA (US); Richard N. Whyne, Mechanicsburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/072,749

(22) Filed: Feb. 6, 2002

(51) Int. Cl.[7] .................................................. H01R 4/50
(52) U.S. Cl. ...................................................... 439/342
(58) Field of Search ................................. 439/342, 341, 439/70, 526, 527, 218, 326

(56) References Cited

U.S. PATENT DOCUMENTS

| | | | | |
|---|---|---|---|---|
| 5,037,321 A | * | 8/1991 | Uratsuji et al. | 439/259 |
| 5,547,389 A | * | 8/1996 | Hsu | 439/342 |
| 6,059,596 A | * | 5/2000 | Pei et al. | 439/342 |
| 6,379,172 B1 | * | 4/2002 | Howell et al. | 439/259 |

* cited by examiner

*Primary Examiner*—Tulsidas Patel
*Assistant Examiner*—Phuong K T Dinh

(57) ABSTRACT

A socket is provided for receiving electronic packages having different first and second sizes. The socket comprises a base housing having a top surface including an array of pin receiving chambers as well as base side walls. The socket also comprises a cover having a top surface including an array of holes corresponding to the array of pin receiving chambers. The cover also includes cover side walls that slidably engage the base side walls. Further, the socket comprises first and second locating members provided on at least one of the base housing and cover. The first locating member is positioned to engage and align an electronic package having a first size with the array of holes in the cover, and the second locating member is positioned to engage and align an electronic package of a second size with the array of holes in the cover.

26 Claims, 16 Drawing Sheets

SOCKET FOR PIN GRID ARRAY PACKAGE

BACKGROUND OF THE INVENTION

Certain embodiments of the present invention generally relate to a socket that can accept differently sized electronic packages.

Pin grid array (PGA) sockets are used to accept electronic packages on printed circuit boards. PGA sockets facilitate electrical communication between a large number of pins born on electronic packages (such as microprocessors) and electrical components to which the PGA sockets are mounted (such as circuit boards). Zero insertion force PGA sockets utilize a cover that is slidably movable on a base between open and closed positions. The sliding movement may be actuated, for example, by a lever. The cover has a hole array configured to match a pin array on an electronic package. Similarly, the base has an array of pin receiving chambers configured to accept the pin array of the electronic package. The electronic package is mated to the socket by first placing the electronic package such that its pins penetrate the holes of the cover. With the cover in the open position, the pins penetrate through the holes of the cover and into the pin receiving chambers of the base but are not electrically connected to the pin receiving chambers of the base. When the cover is slid to the closed position, the pins are electrically connected to the base via the pin receiving chambers.

Improper alignment of the electronic package and socket during mating can result in damage to the pins and/or pin receiving chambers. Additionally, attempting to mount the electronic package to the cover when the cover is in the closed position can also result in damage to the pins and/or the pin receiving chambers. Thus, the socket may incorporate features that aid in the alignment of the electronic package.

Changes in electronic package design have resulted in electronic packages that have similar pin arrays but different outside dimensions. Current sockets, however, only provide for the alignment of a single size of electronic package, and cannot align differently sized electronic packages. Thus, it is required to use different sockets to accommodate differently sized electronic packages, and if the electronic package for an electrical system is changed, the socket must also be changed, resulting in larger required inventories of parts and the time, expense, and inconvenience associated with changing sockets.

It is an object of at least certain embodiments of the present invention to overcome the above-noted and other disadvantages of PGA sockets.

BRIEF SUMMARY OF THE INVENTION

At least one embodiment of the present invention is provided including a socket for receiving electronic packages having different first and second sizes. The socket comprises a base housing having a top surface including an array of pin receiving chambers as well as base side walls. The socket also comprises a cover having a top surface including an array of holes corresponding to the array of pin receiving chambers. The cover also includes cover side walls that slidably engage the base side walls. Further, the socket comprises first and second locating members provided on at least one of the base housing and cover. The first locating member is positioned to engage and align an electronic package having a first size with the array of holes in the cover, and the second locating member is positioned to engage and align an electronic package of a second size with the array of holes in the cover. Optionally, either the first and/or second locating member may be adapted to engage an electronic package during mounting to the socket but not after mounting to the socket. The socket may also comprise relieved portions from the top surface of the cover to facilitate removal of an electronic package from the socket.

The first and second locating members may provide a mechanical stop that locates electronic packages in at least one of a lateral and a longitudinal direction. Further, one of the first and second locating members may extend above the top surface of the cover, and the other of the locating members may recess beneath the top surface of the cover. In this regard, the locating member that recesses beneath the top surface of the cover may be adapted to engage and align an electronic package in both a longitudinal and a lateral direction.

One of the first and second locating members may be provided on the base housing while the other locating member is provided on the cover.

Further, at least one of the first and second locating members may be adapted for visual alignment of an electronic package. In this regard, the locating member adapted for visual alignment may be common to the base housing and the cover.

One of the locating members may also be a resiliently flexible locating member. The resiliently flexible locating member comprises a flexing portion affixed to the socket, and is adapted to engage and align an electronic package having a first size and be deflected substantially beneath the top surface of the cover when an electronic package having a second size is mounted to the socket.

At least one embodiment of the present invention provides an electrical system including an electronic package and a socket. The electronic package comprises an array of pins. The socket is configured to receive the electronic package and an electronic package having a different size. The socket comprises a base having a top surface including an array of pin receiving chambers corresponding to the array of pins. The base also includes base side walls. Further, the socket comprises a cover having a top surface including an array of holes corresponding to the array of pin receiving chambers and the array of pins. The cover includes cover side walls connected to the top surface which slidably engage the base side walls, allowing the array of pins to be slid into and out of engagement with the array of pin receiving chambers. The socket further comprises first and second aligning surfaces on at least on of the base and cover. The first aligning surface is positioned to align the electronic package with the array of holes in the cover, while the second aligning surface is positioned to align an electronic package having a different size with the array of holes in the cover. Optionally, the aligning surfaces may be configured to provide a mechanical stop and/or visual alignment. An aligning surface adapted for visual alignment may further be adapted to facilitate removal of the electronic package from the socket.

At least one embodiment of the present invention provides a socket for receiving electronic packages having different first and second sizes. The socket comprises a base housing having a top surface including an array of pin receiving chambers. The base housing also has base side walls. The socket also comprises a cover having a top surface including an array of holes corresponding to the array of pin receiving chambers. Further, the cover includes cover side walls that slidably engage the base side walls. The socket also comprises a first locating member on the base housing positioned to engage and align an electronic package of a first size with the array of holes in the cover.

Certain embodiments of the present invention thus provide a socket capable of aligning variously sized electronic packages. Certain embodiments of the present invention also provide a socket that prevents electronic packages from being mounted to the socket when the socket is in the closed position.

Figure 1:
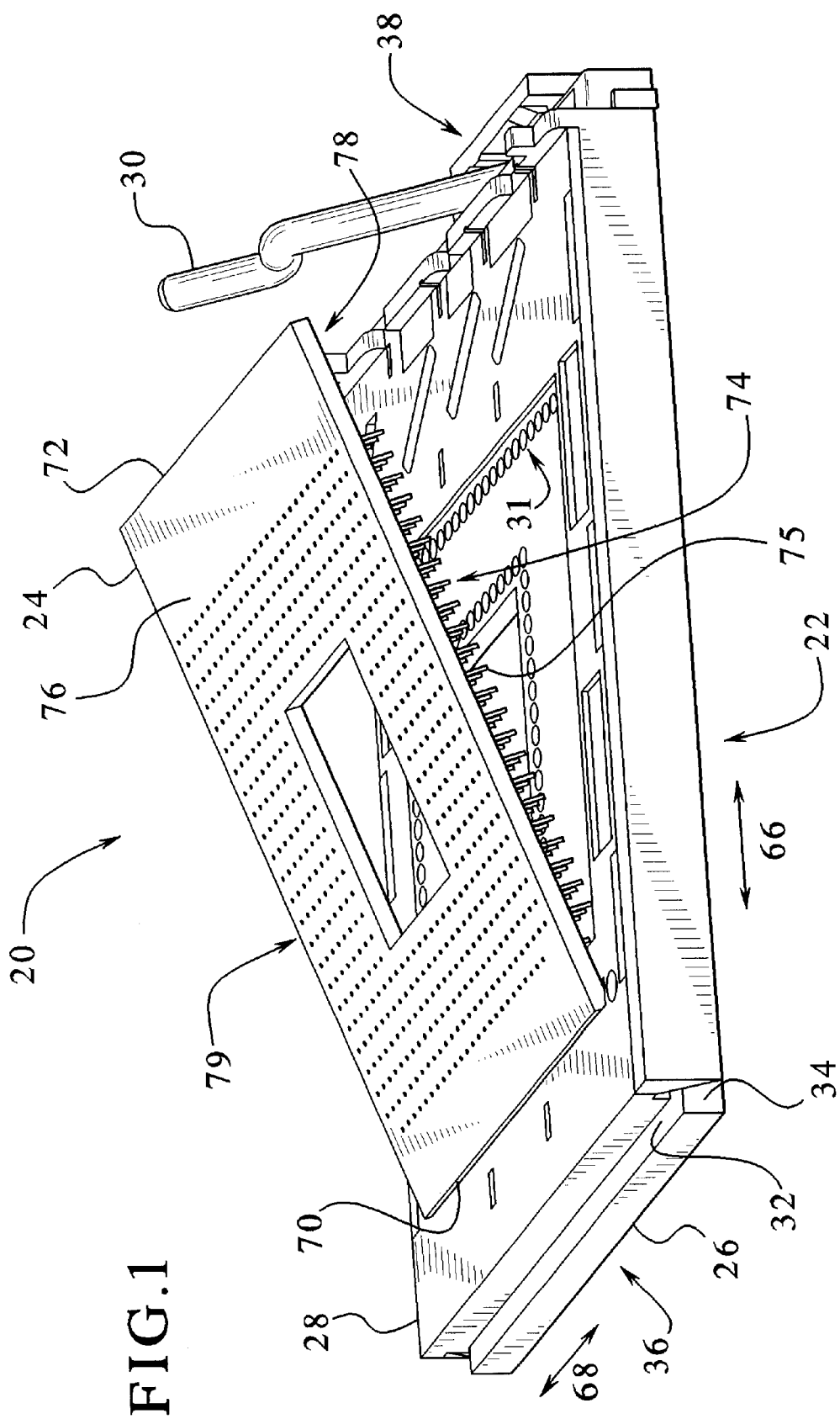
FIG. 1 illustrates a perspective view of a PGA assembly formed in accordance with an embodiment of the present invention during mating of a package to a socket.

The foregoing summary, as well as the following detailed description of the preferred embodiments of the present invention, will be better understood when read in conjunction with the appended drawings. For the purpose of illustrating the invention, there is shown in the drawings, embodiments which are presently preferred. It should be understood, however, that the present invention is not limited to the precise arrangements and instrumentality shown in the attached drawings.

DETAILED DESCRIPTION OF THE INVENTION

Figure 2:
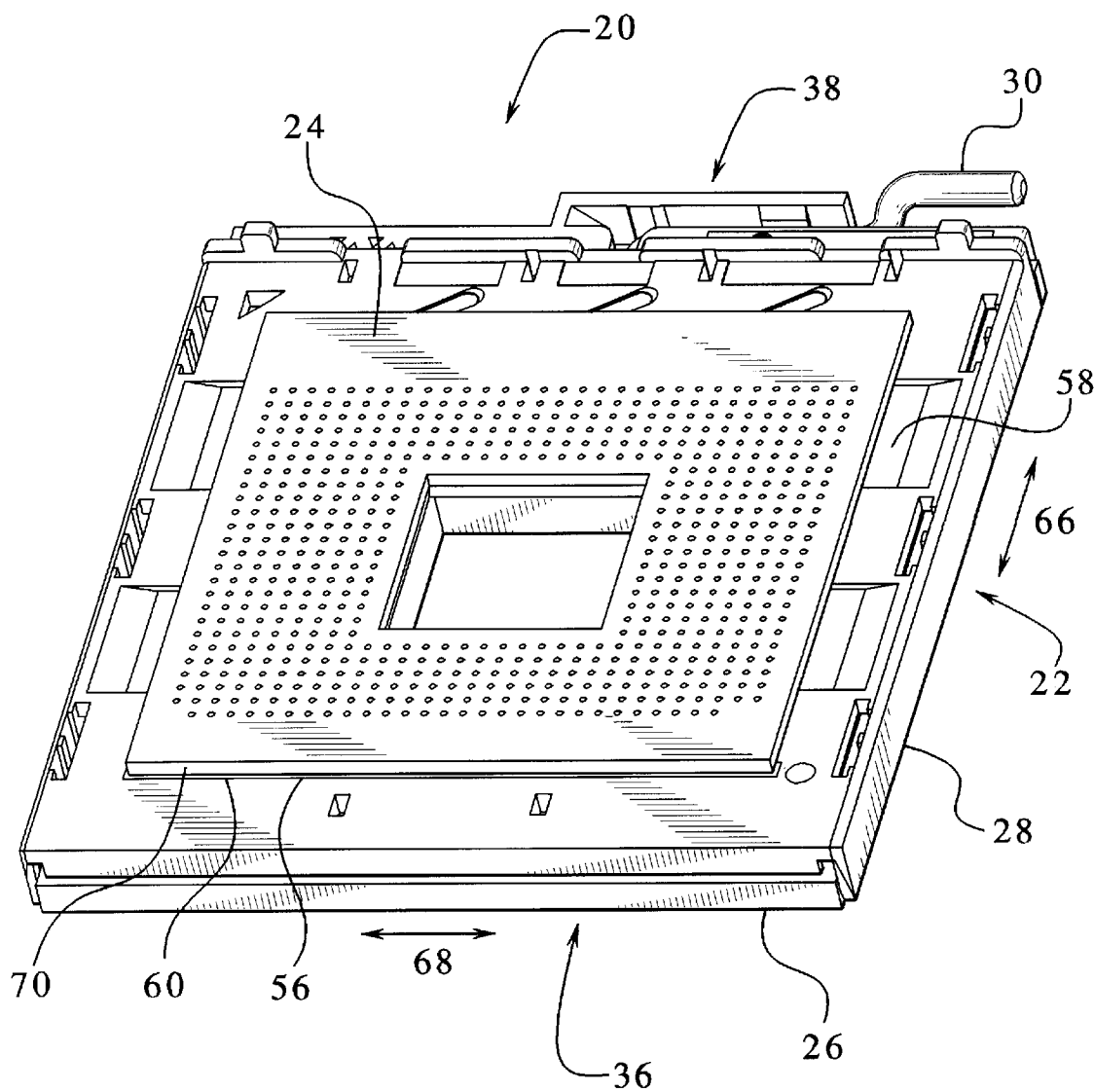
FIG. 2 illustrates a perspective view of the PGA assembly of FIG. 1 after mating of a first electronic package to a socket.

FIG. 1 illustrates an embodiment of a PGA assembly 20 during mating of a first electronic package 24 to a socket 22, and FIG. 2 illustrates the PGA assembly 20 once fully mated. The socket 22 comprises a base housing 26, a cover 28, and a lever 30. The cover 28 slidably engages the base housing 26. The lever 30 is rotatable between open and closed positions, and is used to actuate the sliding movement of the cover 28 on the base housing 26 through the use of a cam mechanism (not shown). In FIG. 1 the lever 30 is in the open position. In FIG. 2, the lever 30 is in the closed position. Before mating, the lever 30 is in the open position. The first electronic package 24 is then placed on the cover 28 such that the pins of the first electronic package 24 are received by holes in the cover 28. With the lever 30 in the open position and the first electronic package 24 mounted to the cover 28, the pins of the first electronic package 24 extend through the cover 28 into the pin receiving chambers of the base housing 26. The lever 30 may then be moved to the closed position, which causes the cover 28 to slide along the base housing 26 such that the pins of the first electronic package 24 become firmly electrically connected to contacts in the pin receiving chambers of the base housing 26.

Figure 3:
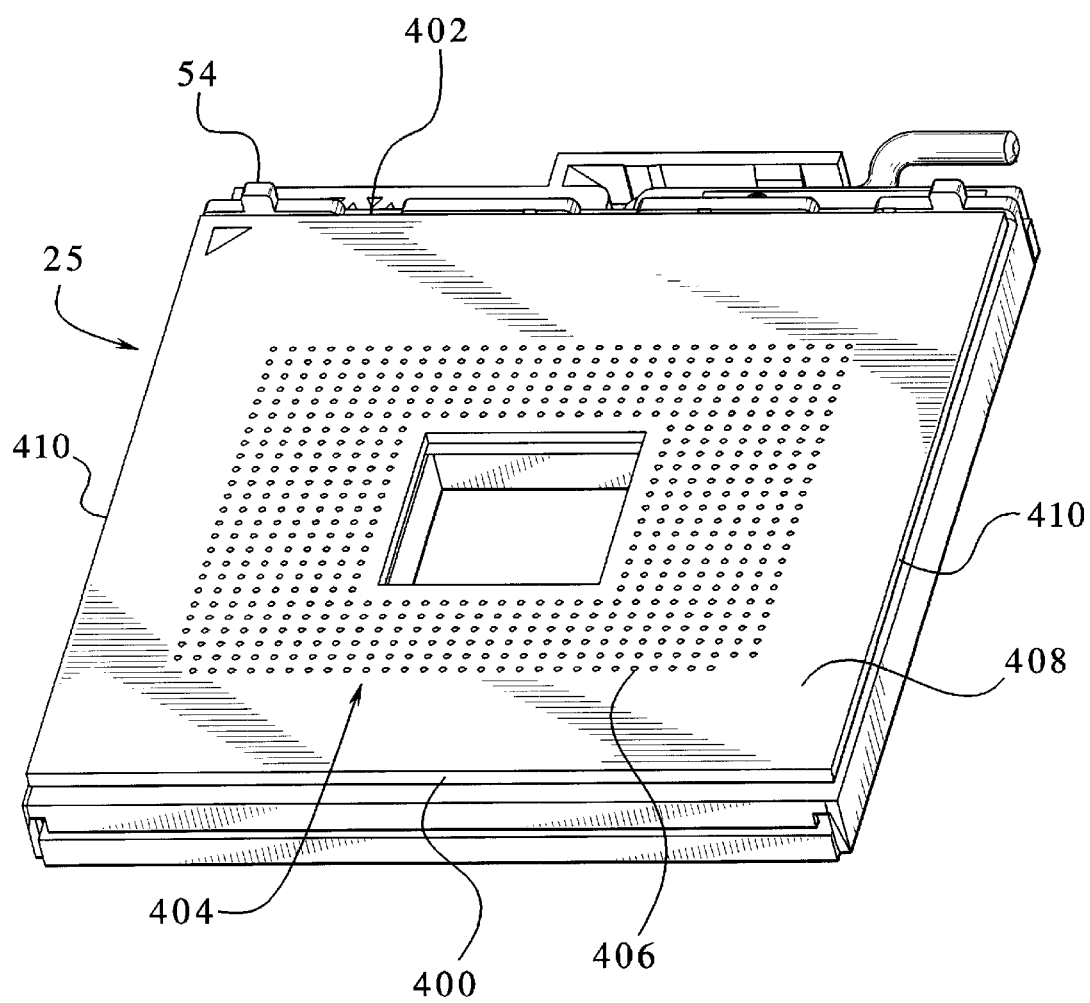
FIG. 3 illustrates a perspective view of the PGA assembly of FIG. 1 after mating of a second electronic package to a socket.

The socket 22 is configured t o be matable to electronic packages of different sizes. For instance, the first electronic package 24 has a first size, however, the socket 22 could also be used with a second electronic package 25, as illustrated in FIG. 3. For example, the first electronic package 24 may be 42.5 mm×42.5 mm, and the second electronic package may be 53.5 mm×53.5 mm. Optionally, one electronic package may be square, while another electronic package may be rectangular.

The base housing 26 comprises an array of pin receiving chambers 31, a top surface 32, base side walls 34, a front end 36, and a back end 38. The array of pin receiving chambers 31 is located proximal to the interior of the top surface 32, and is configured to accept the pins of an electronic package. The pin receiving chambers are configured so that the pins of an electronic package may reside in the pin receiving chambers without being electrically connected thereto when the lever 30 is in the open position, but will be electrically connected thereto when the lever 30 is in the closed position. The base side walls 34 are adapted to slidably engage corresponding side walls 48 of the cover 28. The lever 30 is mounted to the base housing 26 proximal to the back end 38 of the base housing 26. When the lever 30 is moved from the open position to the closed position, the cover 28 slides on the base housing 26 away from the back end 38 and toward the front end 36 of the base housing 26. As used herein, the longitudinal direction 66 corresponds to the direction in which the cover 28 slides upon the base housing 26, and the lateral direction 68 is perpendicular to the longitudinal direction 66. The length of components described herein corresponds to the longitudinal direction 66, and the width of components corresponds to the lateral direction 68.

Figure 4:
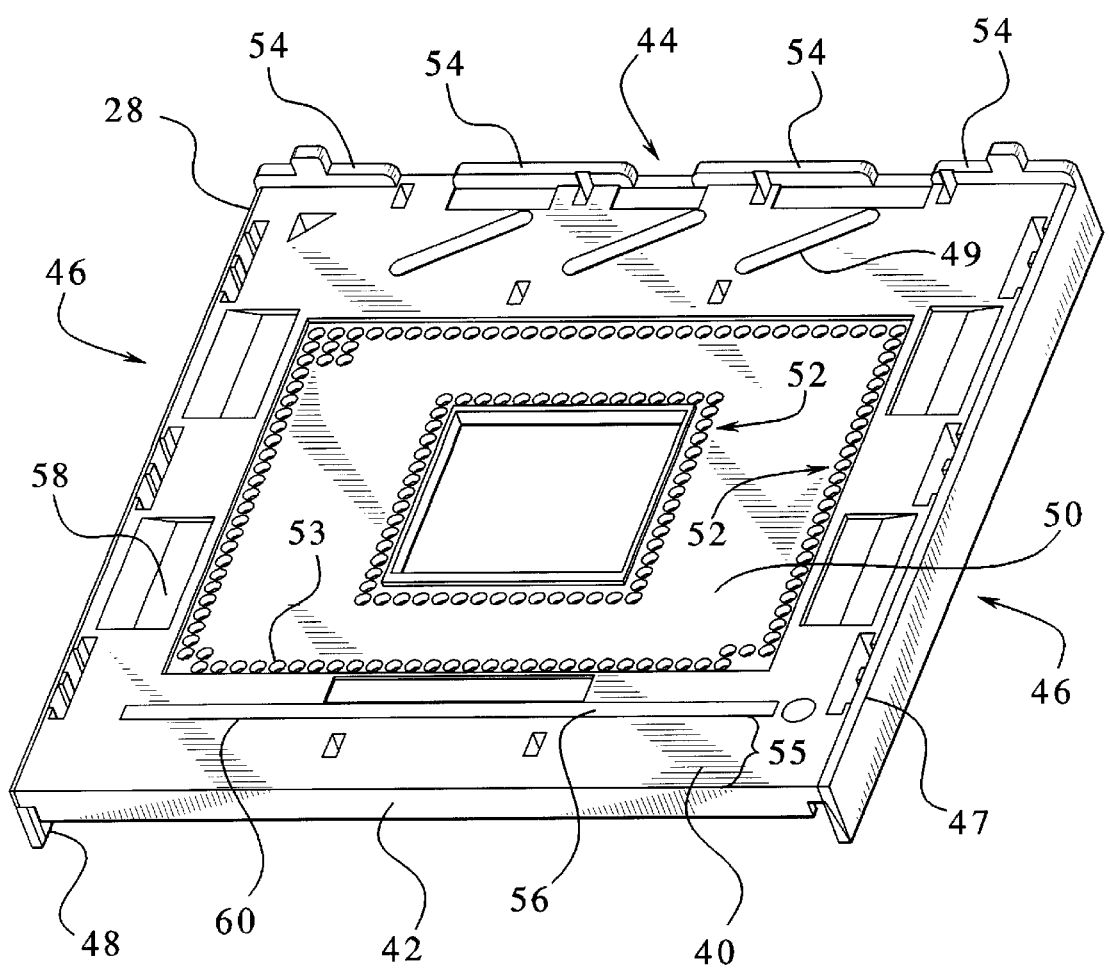
FIG. 4 illustrates a perspective view of a cover formed in accordance with an embodiment of the present invention for the PGA assembly of FIG. 1.

FIG. 4 illustrates a perspective view of the cover 28. The cover 28 comprises a top surface 40, a front end 42, a back end 44, sides 46, cover side walls 48, slots 49, a package receiving area 50, a hole array 52, a rail 54, a notch 56, and recesses 58. The notch 56 extends parallel to and is spaced from the front end 42 by a distance 55. The front end 42 and back end 44 are aligned with the front end 36 and back end 38 of the base housing 26, and are joined by sides 46. The sides 46 meet the top surface 40 at the lateral edges 47. The cover 28 is sized to have a width between the lateral edges 47 that is the same as the width of the second or larger electronic package. The cover side walls 48 are configured to slidably engage the base side walls 34. The slots 49 are configured to accept an actuating mechanism (not shown) driven by the lever 30 to slidably move the cover 28 relative to, and along the length of, the base housing 26.

The package receiving area 50 is located proximal to the interior of the top surface 40 of the cover 28, and is adapted to accept the footprint of electronic packages. The hole array 52 corresponds to the array of pin receiving chambers 31 of the base housing 26 and is configured to accept the pins of electronic packages. The hole array 52 comprises holes 53 which feature a counterbore tapered such that the diameter of the holes 53 is greatest proximal to the top surface 40 of the cover 28.

The cover 28 also comprises a rail 54 and a notch 56. The rail 54 is located proximal to the back end 44 of the cover 28. As shown in FIG. 4, the rail 54 extends across the width of the cover 28 in intermittent portions. The rail 54 extends above the top surface 40. The rail 54 is located and configured to engage and align a second electronic package during the mating of the second electronic package 25 (FIG. 3) and the socket 22.

Figure 5:
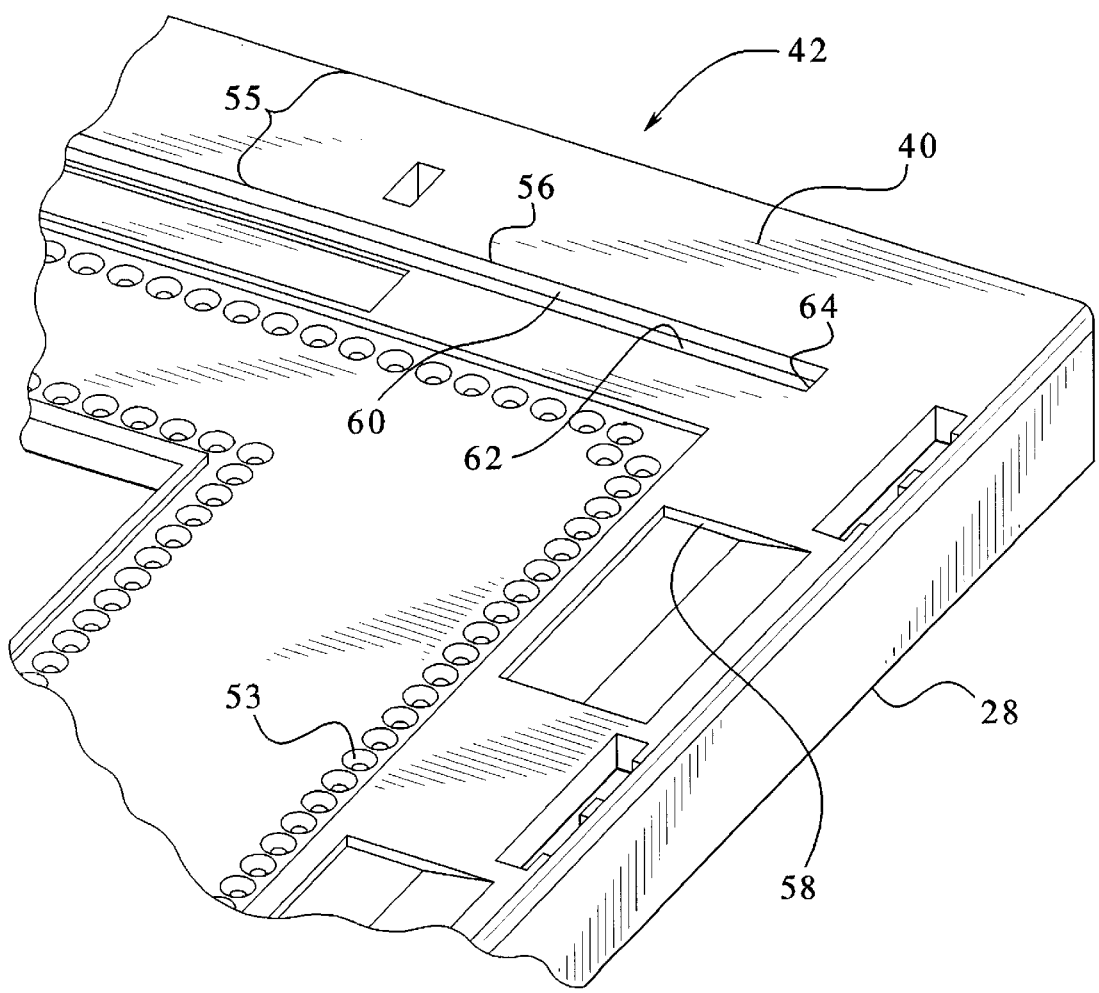
FIG. 5 illustrates an enlarged view of the cover of FIG. 4.

Located nearer the front end 42 of the cover 28, the notch 56 recesses beneath the top surface 40, and is centered along the width of the top surface 40. As shown in FIG. 5, the notch 56 comprises a front wall 60, a bottom surface 62, and ends 64. The front wall 60 is substantially perpendicular to the bottom surface 62. The bottom surface 62 slopes from the top surface 40 in a direction beneath the top surface 40 and toward the front end 42 until it meets the front wall 60. The ends 64 extend downward from the top surface 40 substantially parallel to the sides 46. The notch 56 is located and configured to engage and align the first electronic package 24 during mating of the first electronic package 24 and the socket 22.

The cover 28 also comprises recesses 58 spaced at a distance slightly less than the width of the first electronic package 24 across the width of the cover 28. The recesses 58 are sized to allow removal of the first electronic package 24 with the use of an operator's fingertips.

Referring to FIG. 1, the first electronic package 24 comprises a front edge 70, a back edge 72, a pin array 74, a top surface 76, a bottom surface 78, and sides 79. The sides 79 are located opposite of each other and join the front edge 70 and the back edge 72. A microprocessor and/or other components (not shown) are mounted on the top surface 76 of the first electronic package 24. The pin array 74, which comprises pins 75, extends from the top surface 76 through and beyond the bottom surface 78 and is configured to be accepted by the hole array 52 of the cover 28 as well as the array of pin receiving chambers 31 of the base housing 26. The pins 75 provide electrical communication between the socket 82 and the components mounted on the first electronic package 24. The front edge 70 and the back edge 72 are substantially perpendicular to the top surface 76 and the bottom surface 78. The front and back edges 70, 72 correspond directionally generally to the front end 42 and back end 44 of the cover 28, respectively (and, similarly, to the front end 36 and back end 38 of the base housing 26, respectively).

Referring to FIG. 3, the second electronic package 25 comprises a front edge 400, a back edge 402, a pin array 404, a top surface 408, a bottom surface opposite the top surface 408, and sides 410. The sides 410 are located opposite of each other and join the front edge 400 and the back edge 402. The pin array 404, which comprises pins 406, extends from the top surface 408 through and beyond the bottom surface and is configured to be accepted by the hole array 52 of the cover 28 as well as the array of pin receiving chambers 31 of the base housing 26. The pins 406 provide electrical communication between the socket 82 and the components mounted on the second electronic package 25. The front edge 400 and the back edge 402 are substantially perpendicular to the top surface 408 and the bottom surface. The front and back edges 400, 402 correspond directionally generally to the front end 42 and back end 44 of the cover 28, respectively (and, similarly, to the front end 36 and back end 38 of the base housing 26, respectively).

Referring to FIGS. 1–3, different electronic packages having similar pin arrays may be mated to the socket 22 as will now be described. In FIG. 1, a first electronic package 24 is shown at the beginning of the mating process to the socket 22. To assure proper alignment with the hole array 52 of the cover 28, the notch 56 may be used. First, the first electronic package 24 is lowered with the front edge 70 oriented toward the front end 42 of the cover 28, and tilted so that the front edge 70 is lower than the back edge 72. The first electronic package 24 is then lowered until the front edge 70 is placed within the notch 56, with the front edge 70 abutted against the front wall 60 of the notch 56 (FIG. 5). The width of the notch 56 is sized to accept the first electronic package 24 and align the first electronic package 24 so that the pin array 74 is in proper lateral alignment in the lateral direction 68 with the hole array 52. The ends 64 of the notch 56 provide a positive mechanical stop to prevent the first electronic package 24 from becoming misaligned in the lateral direction 68 during mating to the socket 22. The front wall 60 of the notch 56 is located relative to the hole array 52 such that the pin array 74 of the first electronic package 24 is properly aligned in the longitudinal direction 66 with the hole array 52 when the first electronic package 24 is rotated to be horizontal with respect to the socket 22, namely when the bottom surface 78 of the first electronic package 24 is parallel to and abutted against the top surface 40 of the cover 28. The front wall 60 of the notch 56 provides a positive mechanical stop to prevent the first electronic package 24 from becoming misaligned in the longitudinal direction 66 during mating to the hole array 52.

When the front edge 70 is first inserted into the notch 56, the first electronic package 24 is tilted at an acute angle. As the back edge 72 is lowered, the first electronic package 24 will pivot about the notch 56. As the first electronic package 24 pivots downward, the pins 75 of the pin array 74 begin to enter the holes 53 of the hole array 52. The tapered counterbores of the holes 53 allow the entry of the pins 75 into the holes 53 at the top surface 40, while still allowing the diameter of the holes 53 to be small and (farthest from the top surface 40) to snugly embrace the pins 75 and assure that the first electronic package 24 moves with the cover 28 when the lever 30 is actuated. As the first electronic package 24 is further pivoted, the pins 75 are embraced by the holes 53 and the front edge 70 swings upward out of the notch 56. The bottom surface 78 of the first electronic package 24 abuts against the top surface 40 of the cover 28, and the first electronic package 24 is mounted to the cover 28. The pins 75 extend through the holes 53 and are received by the pin receiving chambers of the base 26. With the lever 30 still in the open position, however, the pins 75 are not fully electrically connected to the pin receiving chambers.

With the first electronic package 24 mounted as described to the cover 28, the lever 30 may now be moved from the open position to the closed position. This movement causes the cover 28 to move toward the front end 36 of the base housing 26. The first electronic package 24 rides atop the cover 28 and the pins 75 of the first electronic package 24 move into electrical contact with the pin receiving chambers of the base housing 26 when the lever 30 has reached the closed position. FIG. 2 illustrates the PGA assembly 20 with the lever 30 in the closed position and the first electronic package 24 mated to the socket 22. To remove the first electronic package 24, the lever 30 is moved to the open position. The first electronic package 24 is then removed by hand, with the recesses 58 providing access for an operator's fingertips to grasp the sides 79 of the first electronic package.

The notch 56 provides positive mechanical stops in both the lateral and longitudinal directions 68 and 66 for accurately locating the first electronic package 24 during mating to the socket 22. This assures quick and accurate placement of the first electronic package 24, thereby reducing assembly time and effort as well as protecting the components from damage caused by misalignment during mating.

FIG. 3 illustrates a second electronic package 25 that is in many respects similar to the first electronic package 24, and has a corresponding front edge 400, back edge 402, top surface 408, bottom surface opposite the top surface, and sides 410. The second electronic package 25 is similar in shape but has a larger envelope than the first electronic package 24. Further, the pin array 404 of the second electronic package 25 is similar to the pin array 74 of the first electronic package 24, thereby allowing both electronic packages to be mounted to the hole array 52 of the cover 28 and to be received by the array of pin receiving chambers 31 of the base housing 26.

To mount the second electronic package 25, the lever 30 begins in the open position. To assure proper longitudinal alignment with the hole array 52 of the cover 28, the rail 54 is be used. First, the second electronic package 25 is lowered with its back edge 402 oriented toward the back end 44 of the cover 28, and tilted so that the back edge 402 of the second electronic package 25 is lower than its front edge 400. Thus, the second electronic package 25 is tilted opposite to the direction the first electronic package 24 is during mating. The second electronic package 25 is then lowered until its back edge 402 abuts against the rail 54. The width of the second electronic package 25 is substantially the same as the width of the cover 28, so that the second electronic package 25 may be visually aligned in the lateral direction 68 by aligning the sides 410 of the second electronic package 25 with the lateral edges 47 of the cover 28. The rail 54 is located such that the pin array 404 of the second electronic package 25 will be in proper longitudinal alignment with the hole array 52 when the second electronic package 25 is tilted back to the horizontal with respect to the socket 22 such that the bottom surface of the second electronic package 25 is substantially parallel to and abutted against the top surface 40 of the cover 28. The rail 54 provides a positive mechanical stop to prevent the second electronic package 25 from getting out of longitudinal alignment during mating to the socket 22.

With the second electronic package 25 positioned such that its back edge 402 abuts against the rail 54, and the second electronic package 25 still tilted such that its front edge 400 is higher than its back edge 402, the front edge 400 may be lowered. As the front edge 400 is lowered, the second electronic package 25 will pivot, and the pins 406 of the second electronic package 25 will begin to enter the holes 53 of the hole array 52. As the second electronic package 25 is further pivoted, the pins 406 are embraced by the holes 53. When the bottom surface of the second electronic package 25 abuts against the top surface 40 of the cover 28, the second electronic package 25 is mounted to the cover 28. The pins 406 extend through the holes 53 and are received by the pin receiving chambers of the base 26. With the lever 30 still in the open position, however, the pins 406 are not fully electrically connected to the pin receiving chambers.

With the second electronic package 25 mounted as described to the cover 28, the lever 30 may now be moved from the open position to the closed position, mating the second electronic package 25 to the socket 22 in a fashion similar to that previously described for the first electronic package 24. To remove the second electronic package 25, the lever 30 is moved to the open position. The second electronic package 25 is then removed by hand by grasping the sides 410 of the second electronic package 25 that are substantially flush with the lateral edges 47 of the top surface 40 of the cover 28.

The rail 54 provides a positive mechanical stop in the longitudinal direction 66, and the lateral edges 47 provide visual alignment in the lateral direction 68 for accurately locating the second electronic package 25 during mating to the socket 22. The notch 56 does not interfere with the second electronic package 25. Thus, electronic packages of differing sizes may be mated to the socket 22.

Figure 6:
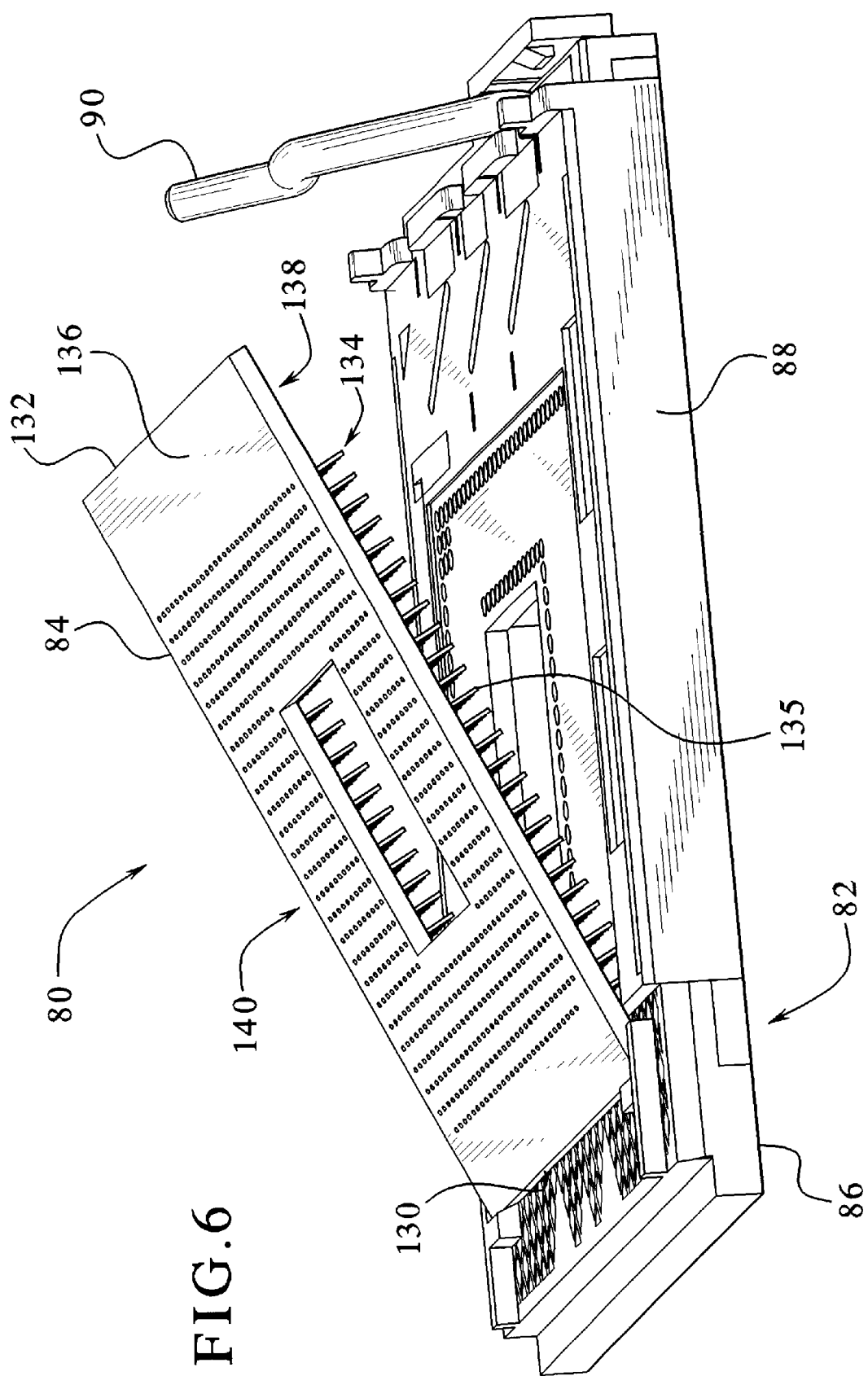
FIG. 6 illustrates a perspective view of a PGA assembly formed in accordance with an alternative embodiment of the present invention during mating of a package to a socket.
Figure 7:
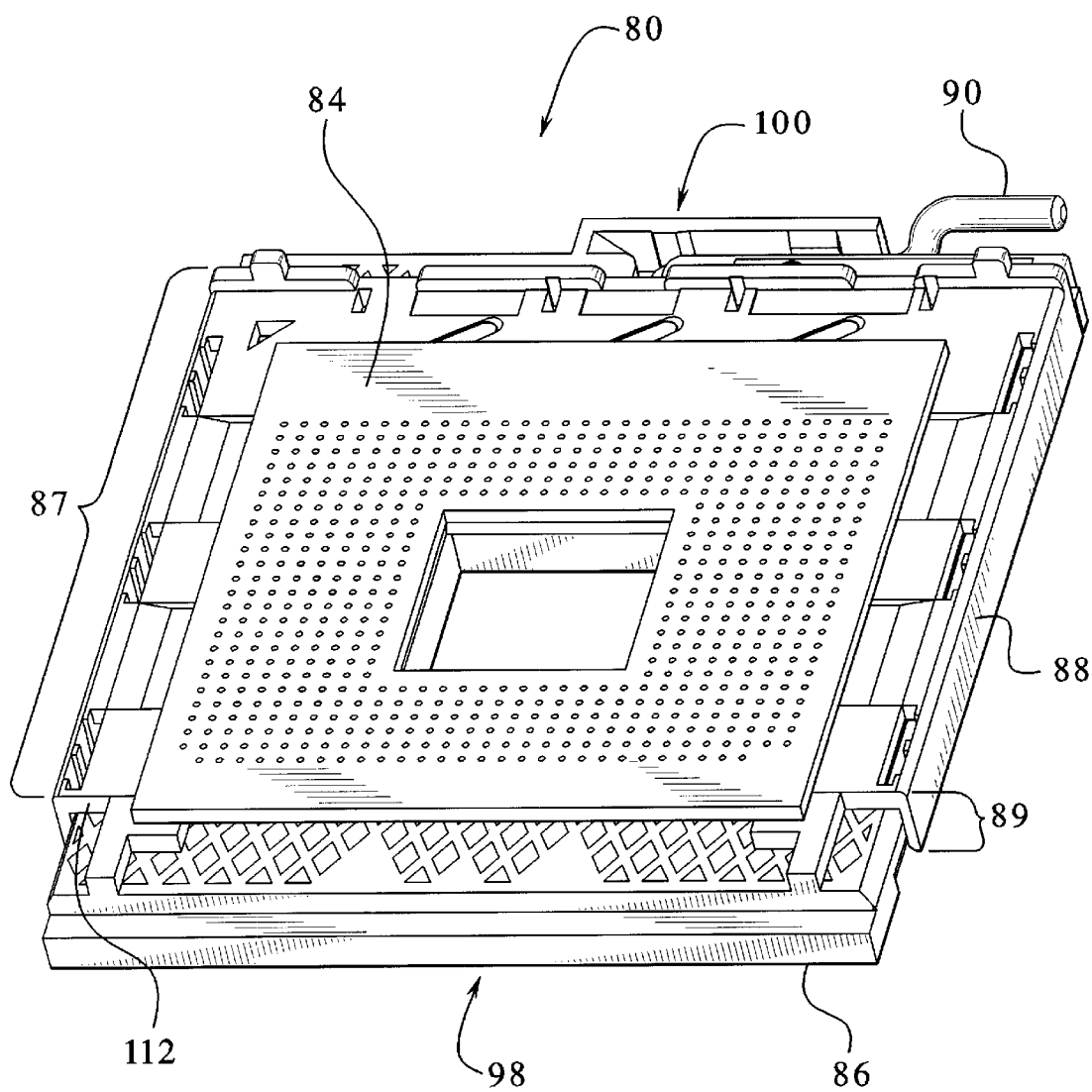
FIG. 7 illustrates a perspective view of the PGA assembly of FIG. 6 after mating of a package to a socket.

FIG. 6 illustrates a PGA assembly 80, formed in accordance with an alternative embodiment. FIG. 7 illustrates the PGA assembly 80 after mating. The socket 82 comprises a base housing 86, a cover 88, and a lever 90. The cover 88 slidably engages the base housing 86. The lever 90 is rotatable between open and closed positions, and is used to actuate the sliding movement of the cover 88 on the base housing 86 through the use of a cam mechanism (not shown). In FIG. 6 the lever 90 is in the open position. In FIG. 7, the lever 90 is in the closed position. Before mating, the lever 90 is in the open position. The first electronic package 84 is placed on the cover 88 such that the pins 135 of the first electronic package 84 are received by holes in the cover 88. The pins 135 of the first electronic package 84 extend into the pin receiving chambers of the base housing 86 but are not fully electrically connected thereto. The lever 90 may then be moved to the closed position, sliding the cover 88 along the base housing 86 such that the pins 135 of the first electronic package 84 (which rides atop the cover 88) are electrically connected to the pin receiving chambers of the base housing 86. The socket 82 may be mated to either a first electronic package 84 of a first size or a second electronic package of a second size.

Figure 8:
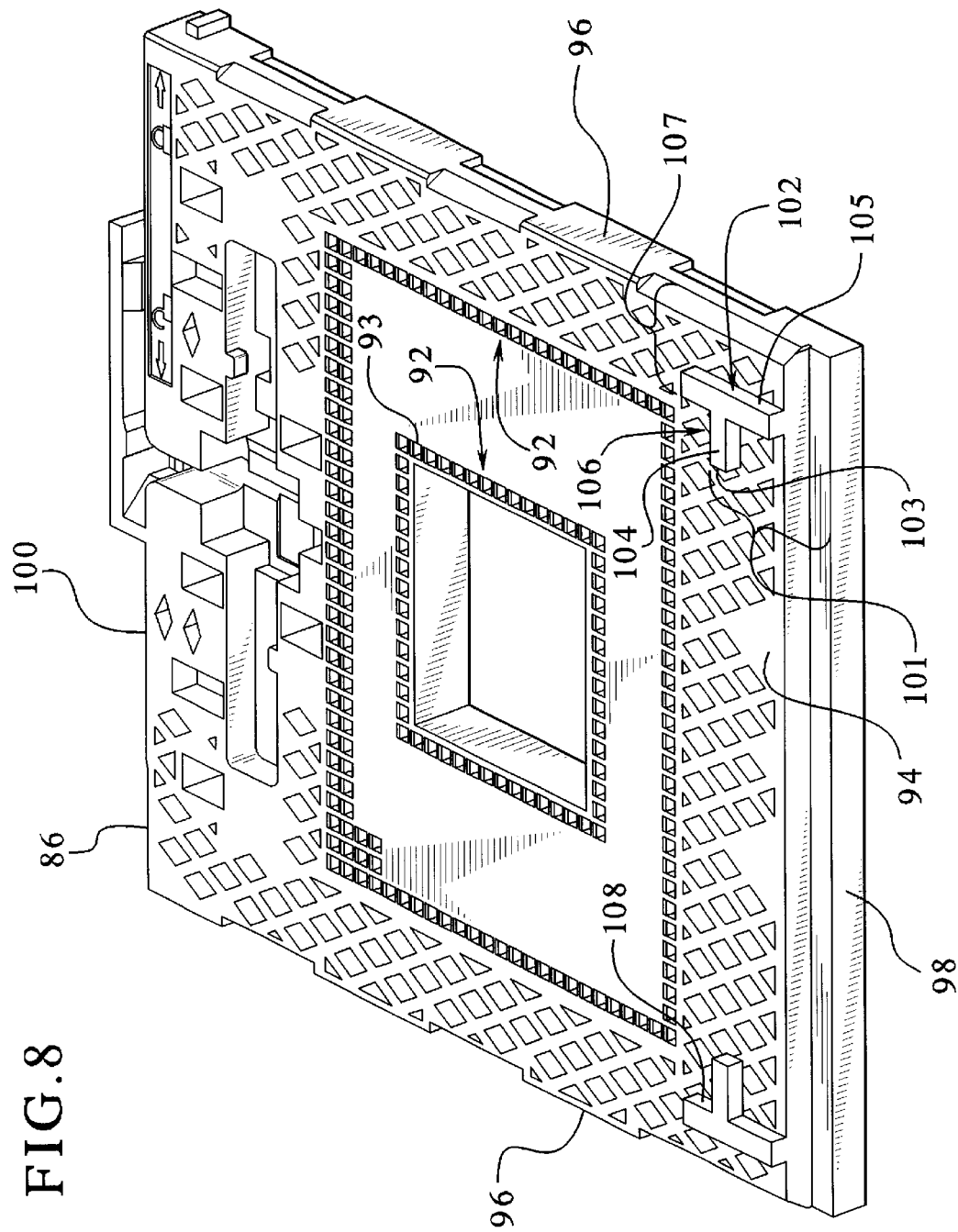
FIG. 8 illustrates a perspective view of a base housing formed in accordance with an embodiment of the present invention for the PGA assembly of FIG. 6.

FIG. 8 illustrates the base housing 86 that comprises an array of pin receiving chambers 92, a top surface 94, base side walls 96, a front end 98, a back end 100, and posts 102. The base side walls 96 are adapted to slidably engage corresponding side walls of the cover 88. The lever 90 is mounted to the base housing 86 proximal to the back end 100 of the base housing 86. When the lever 90 is moved from the open position to the closed position, the cover 88 slides on the base housing 86 away from the back end 100 and toward the front end 98 of the base housing 86.

The array of pin receiving chambers 92, which comprises individual pin receiving chambers 93, is located proximal to the interior of the top surface 94, and is configured to accept the pins 135 (FIG. 6) of an electronic package 84. The pins 135 of an electronic package 84 may reside in the pin receiving chambers 93 without being fully electrically connected thereto when the lever 90 is in the open position, but are fully electrically connected thereto when the lever 90 is in the closed position.

The posts 102 extend above the top surface 94 and are located proximal to the front end 98 of the base housing 86. The post 102 is T-shaped with a ridge section 103 and a T-section 105. Alternatively, the post 102 could be L-shaped. The ridge section 103 extends parallel to the front end 98, while the T-section 105 extends parallel to the base side walls 96. The ridge section 103 includes a front surface 106. The post 102 includes a top surface 104. The T-sections 105 include inner surfaces 108 facing one another. The front surfaces 106 extend in a generally perpendicular direction from the top surface 94 and face toward the back end 100 of the base housing 86. The inner surfaces 108 extend in a generally perpendicular direction from the top surface 94 and face each other. The front surfaces 106 and inner surfaces 108 are spaced distances 101 and 107, respectively, from the front end 98 and base side walls 96. The posts 102 are located and configured to engage and align the first electronic package 84 during mating of the first electronic package 84 and the socket 82.

Figure 9:
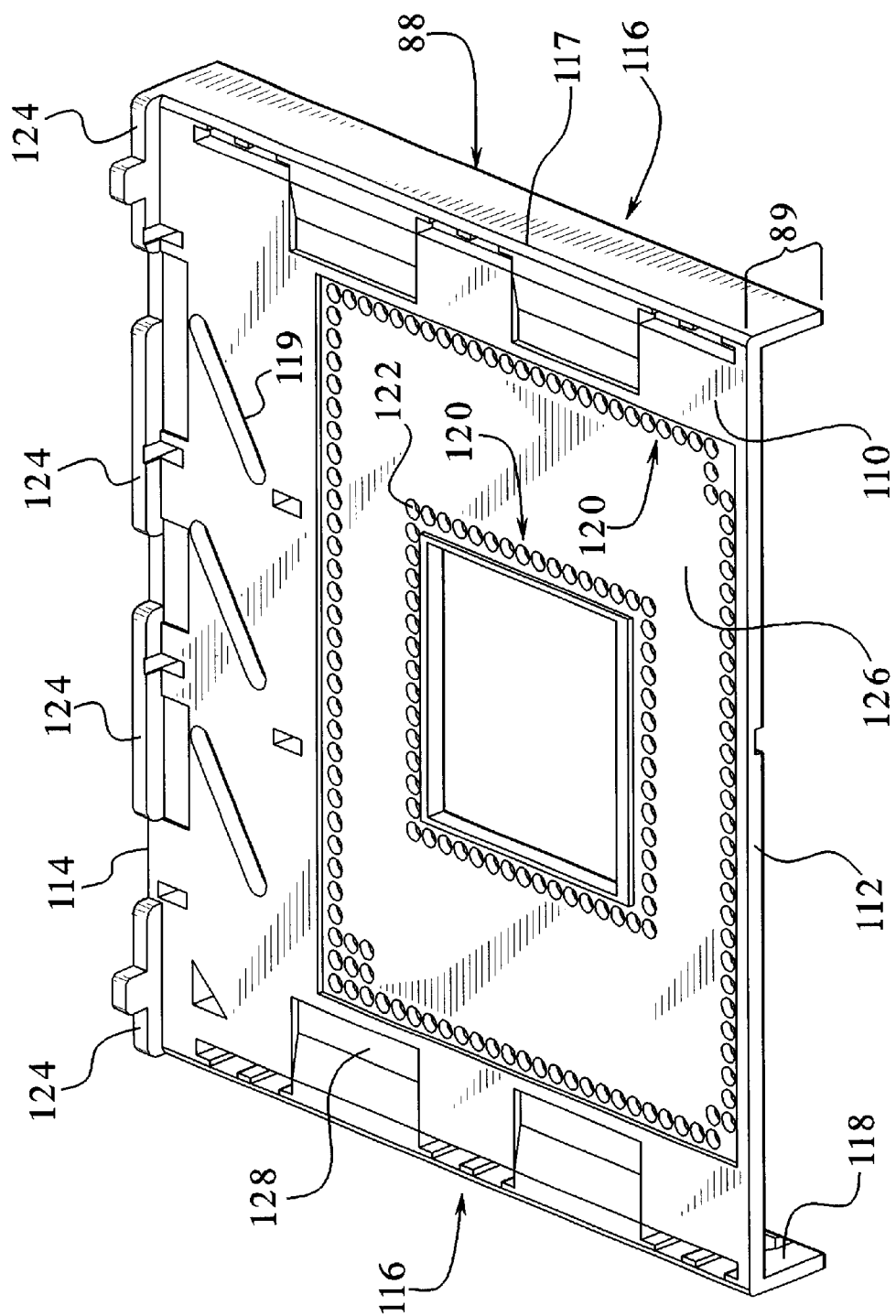
FIG. 9 illustrates a perspective view of a cover formed in accordance with an embodiment of the present invention for the PGA assembly of FIG. 6.

FIG. 9 illustrates a perspective view of the cover 88. The cover 88 comprises a top surface 110, a front end 112, a back end 114, sides 116, cover side walls 118, slots 119, a package receiving area 126, a hole array 120, a rail 124, and recesses 128. The front end 112 and back end 114 are aligned with the front end 98 and back end 100 of the base housing 86. The sides 116 meet the top surface 110 at the lateral edges 117. The cover 88 is sized so the width between the lateral edges 117 is the same as the width of the second electronic package. The cover side walls 118 are configured to slidably engage the base side walls 96. The cover 88 has a height 89 such that the top surface 110 of the cover 88 is slightly higher than the top surfaces 104 of the posts 102 when the cover 88 is assembled with the base housing 86. The slots 119 are configured to accept an actuating mechanism (not shown) that is driven by the lever 90 to slidably move the cover 88 along the length of the base housing 86. As can be seen in FIG. 7, the cover 88 is shorter in length 87 than the cover 28 of the embodiment illustrated in FIGS. 1–5 to allow the posts 102 to extend up beyond the front end 112 of the cover 88.

The package receiving area 126 is located on the top surface 110 of the cover 88, and is adapted to accept the footprint of electronic packages. The hole array 120 corresponds to the array of pin receiving chambers 92 of the base housing 86 and is configured to accept the pins of electronic packages. The hole array 120 comprises holes 122 which feature a counterbore tapered such that the diameter of the holes 122 is greatest proximal to the top surface 110 of the cover 88.

The cover 88 also comprises a rail 124 located proximal to the back end 114. As shown in FIG. 9, the rail 124 extends across the width of the cover 88 in intermittent portions. The rail 124 extends above the top surface 110. The rail 124 is located and configured to align with and engage a second electronic package during the mating of a second electronic package and the socket 82. The cover 88 also comprises recesses 128 spaced at a distance slightly greater than the width of the first electronic package 84 across the width of the cover 88. The recesses 128 are sized to allow removal of the first electronic package 84 with the use of an operator's fingertips.

Referring to FIGS. 6–7, different electronic packages having similar pin arrays may be mated to the socket 82. In FIG. 6, a first electronic package 84 is shown at the beginning of the mating process to the socket 82. To assure proper alignment with the hole array 120 of the cover 88, the posts 102 are used. First, the first electronic package 84 is lowered with the front edge 130 oriented toward the front end 112 of the cover 88, and tilted so that the front edge 130 is lower than the back edge 132. The first electronic package 84 is lowered until the front edge 130 is placed between the posts 102, with the front edge 130 abutted against the front surfaces 106 of the posts 102. The width between the inner surfaces 108 of the posts 102 is sized to accept the first electronic package 84 and align the first electronic package 84 so that the pin array 134 is in proper lateral alignment with the hole array 120. The inner surfaces 108 of the posts 102 provide a positive mechanical stop to prevent the first electronic package 84 from becoming laterally misaligned during mating to the socket 82. The front surfaces 106 of the posts 108 are located such that the pin array 134 of the first electronic package 84 will be in proper longitudinal alignment with the hole array 120 when the first electronic package 84 is horizontal with respect to the socket 82 with the bottom surface 138 of the first electronic package 84 abutted against the top surface 110 of the cover 88. The front surfaces 106 of the posts 102 provide a positive mechanical stop to prevent the first electronic package 84 from becoming longitudinally misaligned during mating to the socket 82.

When the front edge 130 is within the width of the inner surfaces 108 and abuts against the front surfaces 106, the back edge 132 may be lowered. As the front edge 130 is lowered, the first electronic package 84 will pivot about the front end 112 of the cover 88. As the back edge 132 of the first electronic package 84 pivots downward, the pins 135 of the pin array 134 will begin to enter the holes 122 of the hole array 120. As the first electronic package 84 is further pivoted, the pins 135 are embraced by the holes 122 and the front edge 130 swings upward, clearing the front surfaces 106 and the inner surfaces 108. Further pivoting causes the bottom surface 138 of the first electronic package 84 to abut against the top surface 110 of the cover 88, and the first electronic package 84 is mounted to the cover 88. The bottom surface 138 of the first electronic package 84 is now higher than the top surfaces 104 of the posts 102, so that there is not an interference therebetween when the lever 90 is actuated and the first electronic package 84 and cover 88 slide on the base housing 86. The pins 135 extend through the holes 122 and are received by the pin receiving chambers 93 of the base housing 86. With the lever 90 still in the open position, however, the pins 135 are not fully electrically connected to the pin receiving chambers 93.

The lever 90 may now be moved from the open position to the closed position. This movement causes the cover 88 to move toward the front end 98 of the base housing 86. The first electronic package 84 rides atop the cover 88 and the pins 135 of the first electronic package 84 move into full electrical contact with the pin receiving chambers 93 of the base housing 86 when the lever 90 has reached the closed position. FIG. 7 illustrates the PGA assembly 80 with the lever 90 in the closed position and the first electronic package 84 mated to the socket 82. To remove the first electronic package 84, the lever 90 is moved to the open position. The first electronic package 84 is then removed by hand, with the recesses 128 providing access for an operator's fingertips to grasp the sides 140 of the first electronic package 84.

The posts 102 provide positive mechanical stops in both the lateral and longitudinal directions for accurately locating the first electronic package 84 during mating to the socket 82. This assures quick and accurate placement of the first electronic package 84, thereby reducing assembly time and effort as well as protecting the components from damage caused by misalignment during mating. Because the posts 102 are mounted to the base housing 86, the distance between the posts 102 of the base housing 86 and the hole array 120 of the cover 88 is sensitive to the position of the lever 90. If the lever 90 is in the closed position, the hole array 120 will be out of lateral alignment with a first electronic package 84 that is aligned with the aid of the posts 102. This misalignment helps prevent the pins 135 from being inserted into the pin receiving chambers 93 with the lever 90 in the closed position, thereby preventing damage to the pins 135 and/or the pin receiving chambers 93.

The second electronic package is in many respects similar to the first electronic package 84, and is longitudinally aligned using the rail 124 and laterally aligned visually using the lateral edges 117 of the cover 88, as previously described for the second electronic package 25 of the previous embodiment. The second electronic package is similar in shape but has a larger envelope than the first electronic package 84. Further, the pin array of the second electronic package is the same as the pin array 134 of the first electronic package 84, thereby allowing both electronic packages to be mounted to the hole array 120 of the cover 88 and to be received by the array of pin receiving chambers 92 of the base housing 86.

The rail 124 provides a positive mechanical stop in the longitudinal direction, and the lateral edges 117 provide visual alignment in the lateral direction for accurately locating the second electronic package during mating to the socket 82. Thus, electronic packages of differing sizes may be mated to the socket 82.

Figure 10:
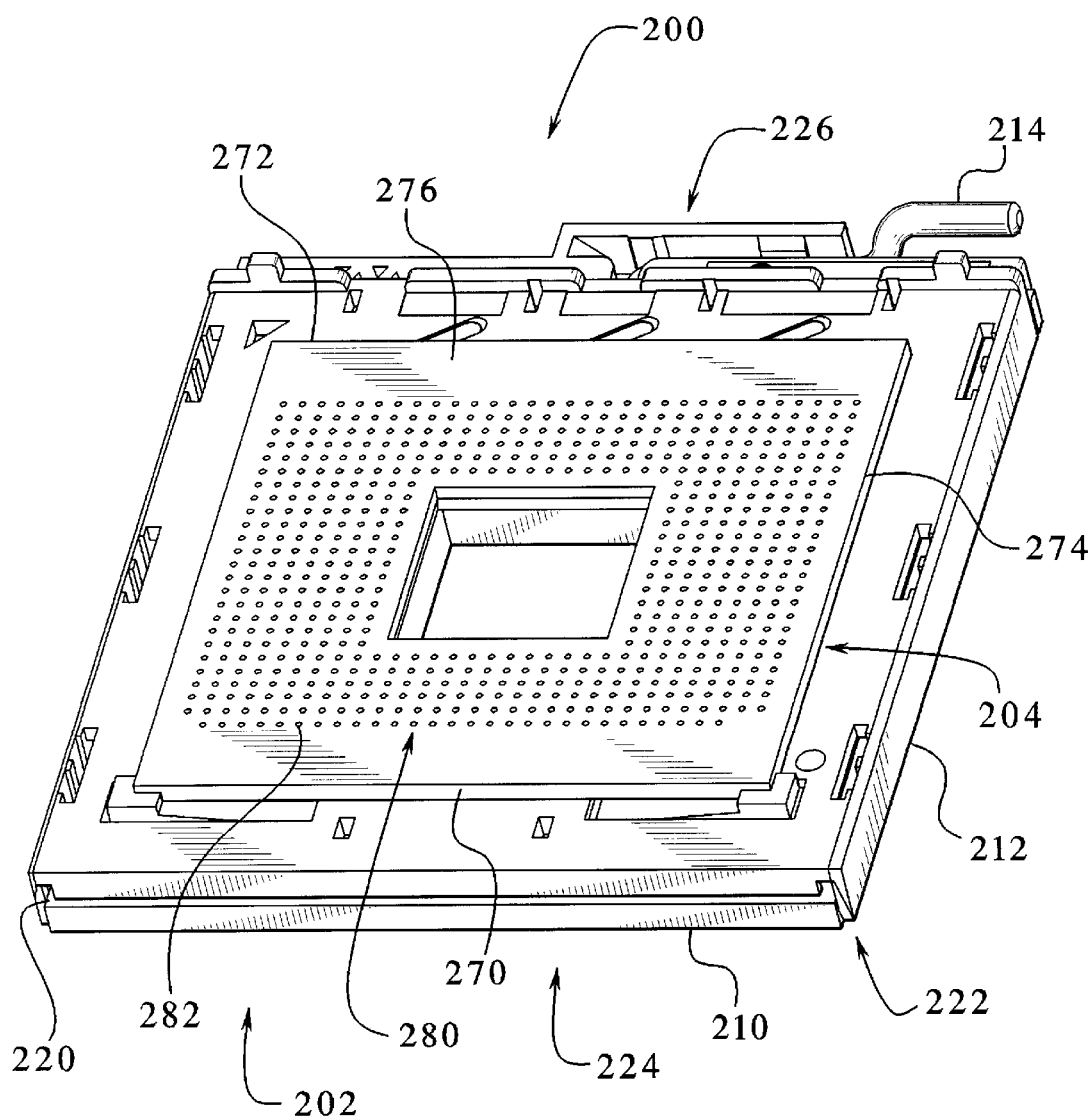
FIG. 10 illustrates a perspective view of a PGA assembly formed in accordance with an alternative embodiment of the present invention.
Figure 11:
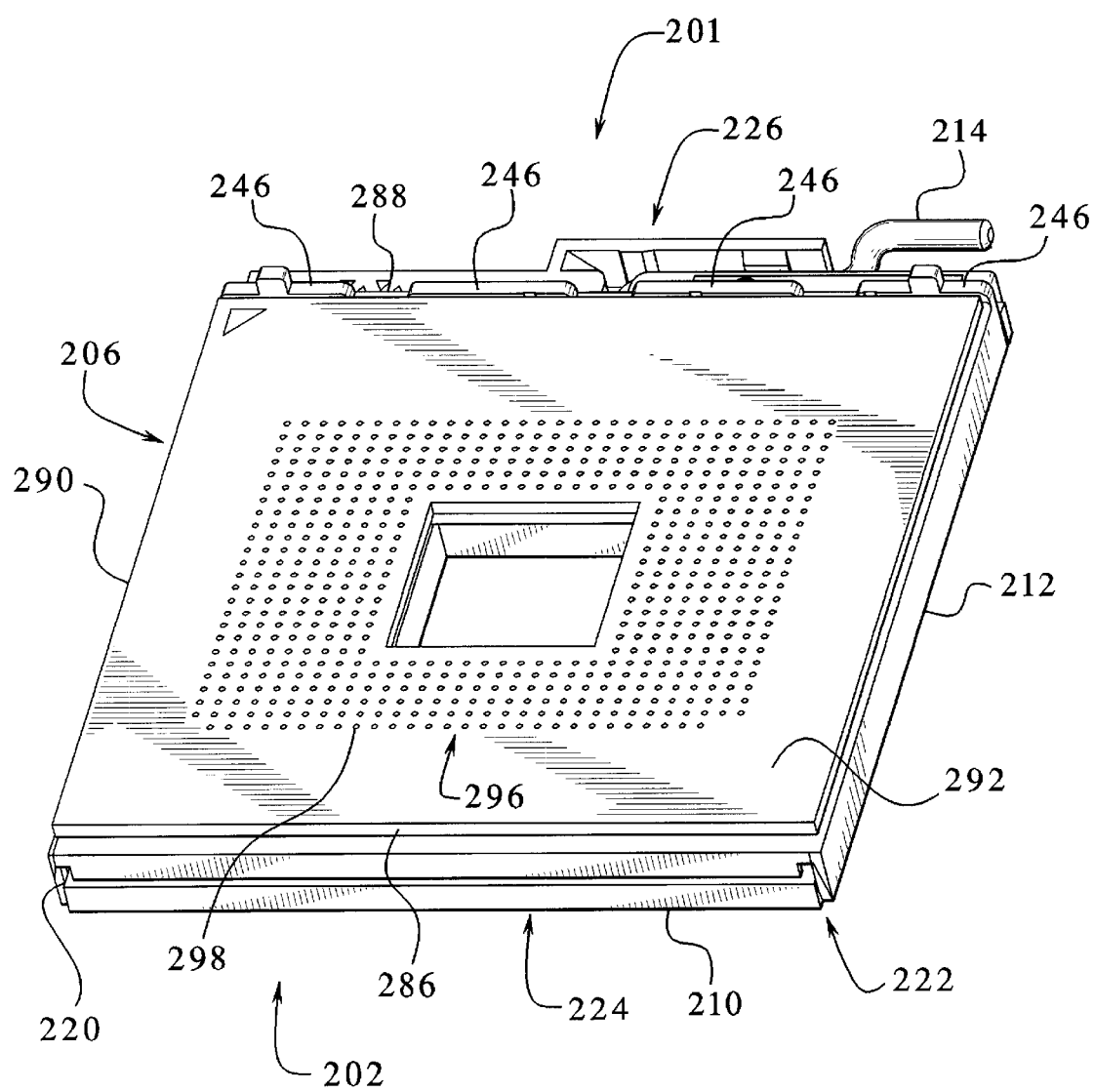
FIG. 11 illustrates a perspective view of a PGA assembly formed in accordance with an alternative embodiment of the present invention.

FIG. 10 illustrates a PGA assembly 200, formed in accordance with an alternative embodiment. FIG. 11 illustrates an embodiment of a PGA assembly 201 comprising a second electronic package 206 mated to a socket 202. The socket 202 comprises a base housing 210, a cover 212, and a lever 214. The cover 212 slidably engages the base housing 210. The lever 214 is rotatable between open and closed positions, and is used to actuate the sliding movement of the cover 212 on the base housing 210 through the use of a cam mechanism (not shown). In FIGS. 10–11, the lever 214 is in the closed position. In its open position, the lever 214 is substantially similar to the levers of the previous illustrated embodiments in their open positions. Before mating, the lever 214 is in the open position. An electronic package (either the first electronic package 204 or the second electronic package 206) is then placed on the cover 212 such that the pins of the electronic package are received by holes in the cover 212. The pins of the electronic package extend into the pin receiving chambers of the base housing 210 but are not fully electrically connected thereto. The lever 214 may then be moved to the closed position, sliding the cover 212 along the base housing 210 such that the pins of the electronic package are fully electrically connected to the pin receiving chambers of the base housing 210. The socket 202 may be mated to either the first electronic package 204 having a first size or the second electronic package 206 having a second size.

The base housing 210 comprises an array of pin receiving chambers (not shown), a top surface 220, base side walls 222, a front end 224, and a back end 226. The array of pin receiving chambers is located on the top surface 220, and is configured to accept the pins of an electronic package. The pin receiving chambers are configured so that the pins of an electronic package may reside in the pin receiving chambers without being fully electrically connected thereto when the lever 214 is in the open position, but are fully electrically connected thereto when the lever 214 is in the closed position. The base side walls 222 are adapted to slidably engage corresponding side walls of the cover 212. The lever 214 is mounted to the base housing 210 proximal to the back end 226 of the base housing 210.

Figure 12:
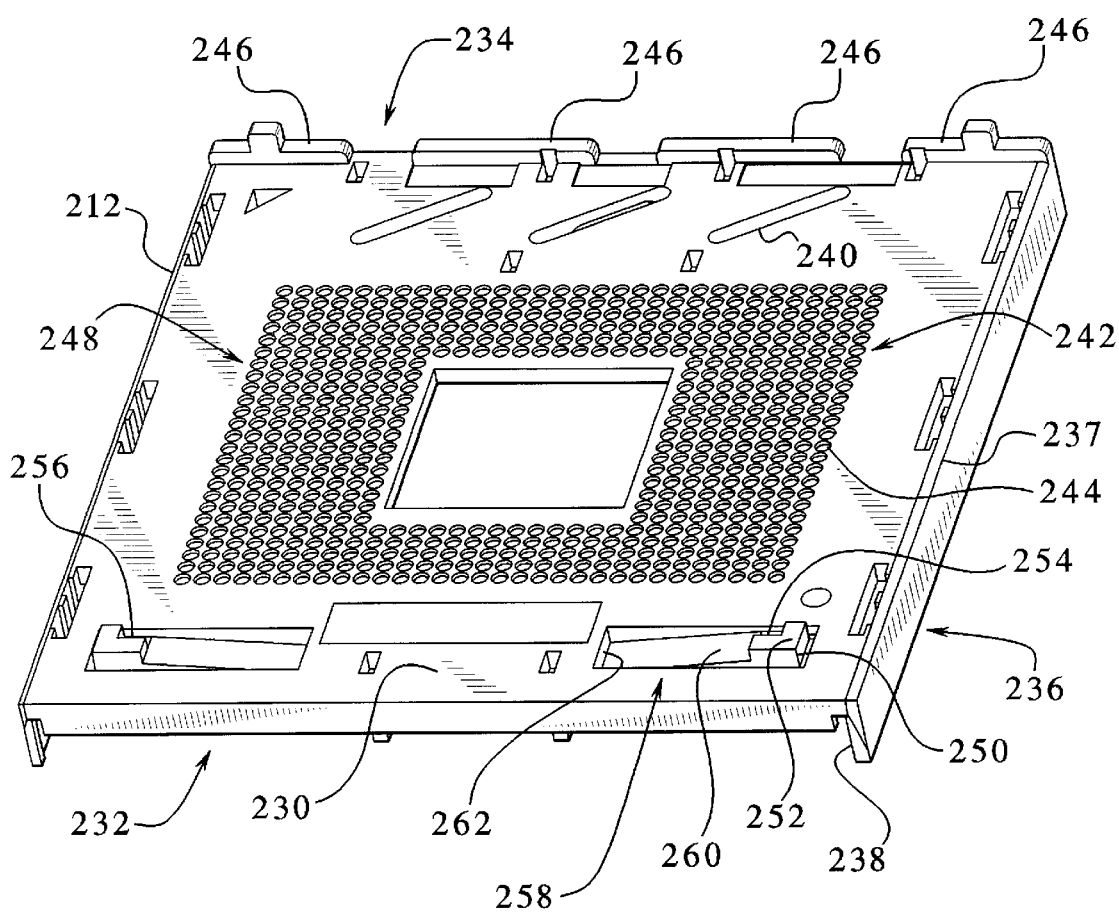
FIG. 12 illustrates a perspective view of a cover formed in accordance with an embodiment of the present invention for the PGA assemblies of FIGS. 10–11.

FIG. 12 illustrates a perspective view of the cover 212. The cover 212 comprises a top surface 230, a front end 232, a back end 234, sides 236, cover side walls 238, slots 240, a package receiving area 248, a hole array 242, a rail 246, posts 250, and beams 258. The front end 232 and back end 234 correspond to the front end 224 and back end 226 of the base housing 210, and are joined by sides 236. The sides 236 meet the top surface 230 at the lateral edges 237, which are spaced at a width substantially the same as the width of the second electronic package 206. The cover side walls 238 are configured to slidably engage the base side walls 222. The slots 240 are configured to accept an actuating mechanism (not shown) responsive to the lever 214 used to slidably position the cover 212 along the length of the base housing 210.

The package receiving area 248 is located proximal to the interior of the top surface 230 of the cover 212, and is adapted to accept the footprint of electronic packages. The hole array 242 corresponds to the array of pin receiving chambers of the base housing 210 and are configured to accept the pins of electronic packages. The hole array 242 comprises holes 244 which feature a counterbore tapered such that the diameter of the holes 244 is greatest proximal to the top surface 230 of the cover 212.

The posts 250 extend above the top surface 230 of the cover 212 proximal to the front end 232 of the cover 212. Each post 250 comprises a top surface 252, a first surface 254, and a second surface 256. The first surfaces 254 extend in a direction generally perpendicular to the top surface 230 of the cover 212 and face toward the back end 234 of the cover 212. The second surfaces 256 extend in a direction generally perpendicular to the top surface 230 of the cover 212 and face each other. In other words, the second surfaces 256 face each other across the width of the cover 212. The posts 250 are located and configured to engage and align the first electronic package 204 during mating of the first electronic package 204 and the socket 202. The posts 250 are connected to the top surface 230 by the beams 258.

Each beam 258 comprises a first portion 260 and a second portion 262. The second portion 262 joins the top surface 230 of the cover 212 and extends downward from it. The first portion 260 joins the second portion 262 at the end of the second portion 262 not joined to the top surface 252. The first portion 260 extends away from the second portion 262 toward the side 236 of the cover 212 and back upward toward the top surface 230. At its end farthest from its connection with the second portion 262, the first portion 260 joins the post 250. The beams 258 provide flexible connections between the posts 250 and the top surface 230. The beams 258 are configured to allow the posts 250 to be biased downward below the top surface 230 of the cover 212 when a downward force is applied to the top surfaces 252 of the posts 250. However, the beams 258 are configured to provide greater resilience in the lateral and longitudinal directions, thereby allowing the posts 250 to be used to align the first electronic package 204.

The cover 212 also comprises a rail 246 located proximal to the back end 234. The rail 246 extends above the top surface 230 and is located and configured to engage and align the second electronic package 206 during the mating of the second electronic package 206 and the socket 202.

Referring to FIGS. 10–11, different electronic packages having similar pin arrays may be mated to the socket 202 as will now be described. In FIG. 10, the first electronic package 204 is shown mated to the socket 202. In FIG. 11, the second electronic package 206 is shown mated to the socket 202.

To assure that the first electronic package 204 is properly aligned with the hole array 242 of the cover 212, the posts 250 are used. The first electronic package 204 is lowered with the front edge 270 oriented toward the front end 232 of the cover 212, and tilted with the front edge 270 lower than the back edge 272. The first electronic package 204 is lowered until the front edge 270 is placed between the posts 250, with the front edge 270 abutted against the first surfaces 254 of the posts 250. The width between the second surfaces 256 of the posts 250 is sized to accept the first electronic package 204 and laterally align the first electronic package 204 with the hole array 242. The second surfaces 256 of the posts 250 provide a positive mechanical stop to prevent the first electronic package 204 from being laterally misaligned during mating to the socket 202. The first surfaces 254 of the posts 250 are located such that the pin array 280 of the first electronic package 204 will be in proper longitudinal alignment with the hole array 242 when the first electronic package 204 is tilted horizontal with respect to the socket 202 with the bottom surface of the first electronic package 204 abutted against the top surface 230 of the cover 212. The first surfaces 254 of the posts 250 provide a positive mechanical stop to prevent the first electronic package 204 from being longitudinally misaligned during mating to the socket 202. The abutment of the first electronic package 204 against the posts 250 during mating does not bias the posts 250 beneath the top surface 230 of the cover 212.

When the front edge 270 is within the width of the second surfaces 256 and abuts against the first surfaces 254, the back edge 272 is lowered. As the first electronic package 204 pivots downward, the pins 282 of the pin array 284 will begin to enter the holes 244 of the hole array 242. Further pivoting causes the bottom surface of the first electronic package 204 to abut against the top surface 230 of the cover 212, and the first electronic package 204 is mounted to the cover 212. The pins 282 extend through the holes 244 and are received by the pin receiving chambers of the base housing 210. With the lever 214 still in the open position, however, the pins 282 are not fully electrically connected to the pin receiving chambers.

The lever 214 is now be moved from the open position to the closed position, moving the cover 212 toward the front end 224 of the base housing 210. The pins 282 of the first electronic package 204 move into full electrical contact with the pin receiving chambers of the base housing 210 when the lever 214 has reached the closed position. To remove the first electronic package 204, the lever 214 is moved to the open position. The first electronic package 204 is then removed by hand.

The posts 250 provide positive mechanical stops in both the lateral and longitudinal directions for accurately locating the first electronic package 204 during mating to the socket 202. This assures quick and accurate placement of the first electronic package 204, thereby reducing assembly time and effort as well as protecting the components from damage caused by misalignment during mating.

The procedures for mating and removal for the second electronic package 206 and the socket 202 are similar to those described for previous embodiments. The second electronic package 206 is laterally aligned visually with its sides 290 in line with the lateral edges 237, and is longitudinally aligned by tilting, back edge 288 down, into abutment against the rail 246. The second electronic package 206 is then rotated downward and its pins 298 enter the holes 244 of the hole array 242 of the cover 212. As the second electronic package 206 rotates downward, the bottom surface of the second electronic package 206 contacts the top surfaces 252 of the posts 250. The downward force of the rotating second electronic package 206 biases the posts 250 downward, until the bottom surface of the second electronic package 206 is substantially parallel to and abutting against the top surface 230 of the cover 212, with the posts 250 biased downward. Once the second electronic package 206 is fully mounted to the cover 212, the lever 214 is moved to the closed position, bringing the pins 298 into full electrical contact with the pin receiving chambers. To remove the second electronic package 206, the lever 214 is moved to the open position. The second electronic package 206 is then removed by hand by grasping the sides 290 of the second electronic package 206 that are substantially flush with the lateral edges of the top surface 230 of the cover 212.

The rail 246 provides a positive mechanical stop in the longitudinal direction, and the lateral edges 237 provide visual alignment in the lateral direction for accurately locating the second electronic package 206 during mating to the socket 202. Thus, electronic packages of differing sizes may be mated to the socket 202.

Figure 13:
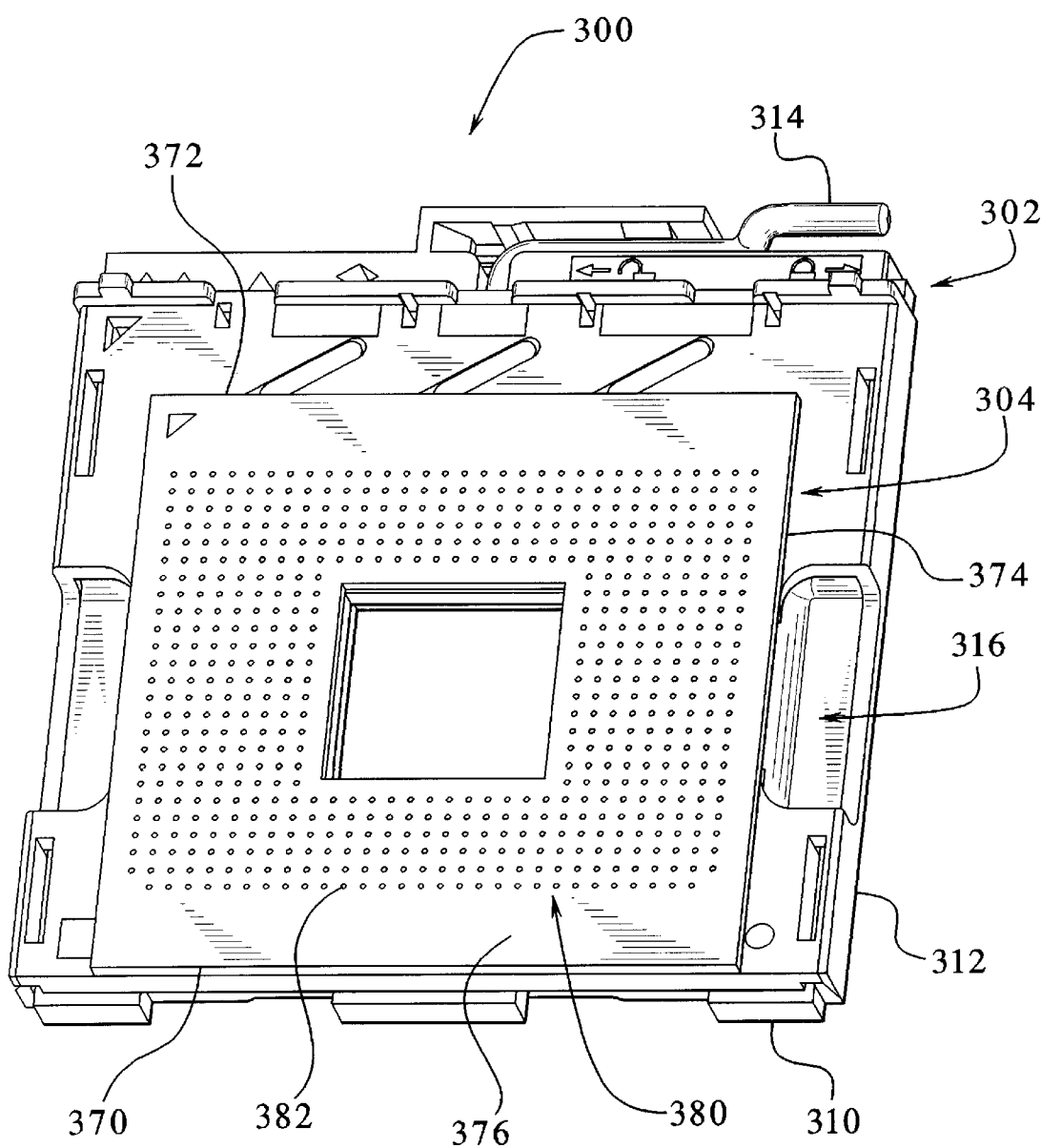
FIG. 13 illustrates a perspective view of a PGA assembly formed in accordance with an alternative embodiment of the present invention.
Figure 14:
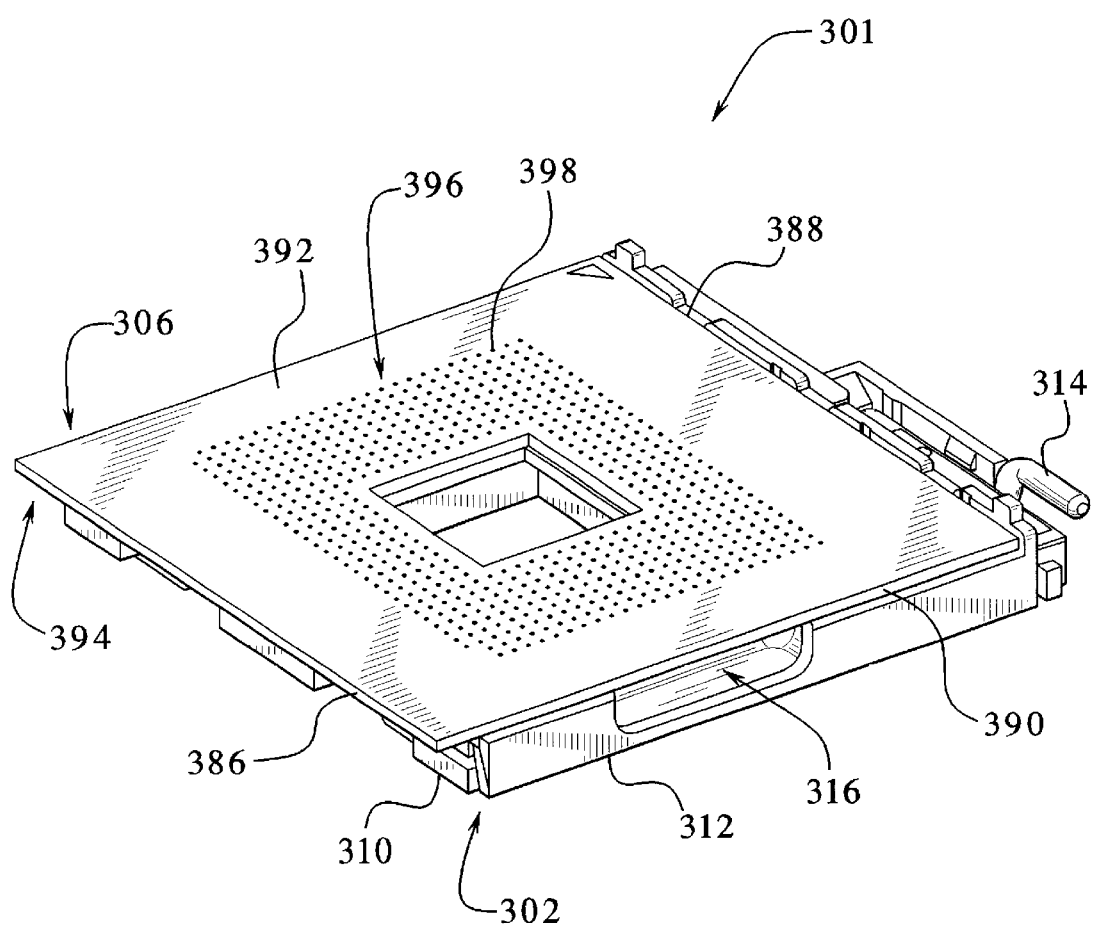
FIG. 14 illustrates a perspective view of a PGA assembly formed in accordance with an alternative embodiment of the present invention.

FIG. 13 illustrates an alternative embodiment of a PGA assembly 300 comprising a first electronic package 304 mated to a socket 302, and FIG. 14 illustrates an embodiment of a PGA assembly 301 comprising a second electronic package 306 mated to a socket 302. The socket 302 comprises a base housing 310, a cover 312, and a lever 314, and socket alignment notches 316. The cover 312 slidably engages the base housing 310. The lever 314 is rotatable between open and closed positions, and is used to actuate the sliding movement of the cover 312 on the base housing 310 through the use of a cam mechanism (not shown). Before mating, the lever 314 is in the open position. An electronic package (either the first electronic package 304 or the second electronic package 306) is then placed on the cover 312 such that the pins of the electronic package are received by holes in the cover 312. The lever 314 may then be moved to the closed position, sliding the cover 312 along the base housing 310 such that the pins of the electronic package are fully electrically connected to the pin receiving chambers of the base housing 310. The socket 302 may be mated to either the first electronic package 304 having a first size or the second electronic package 306 having a second size.

Figure 15:
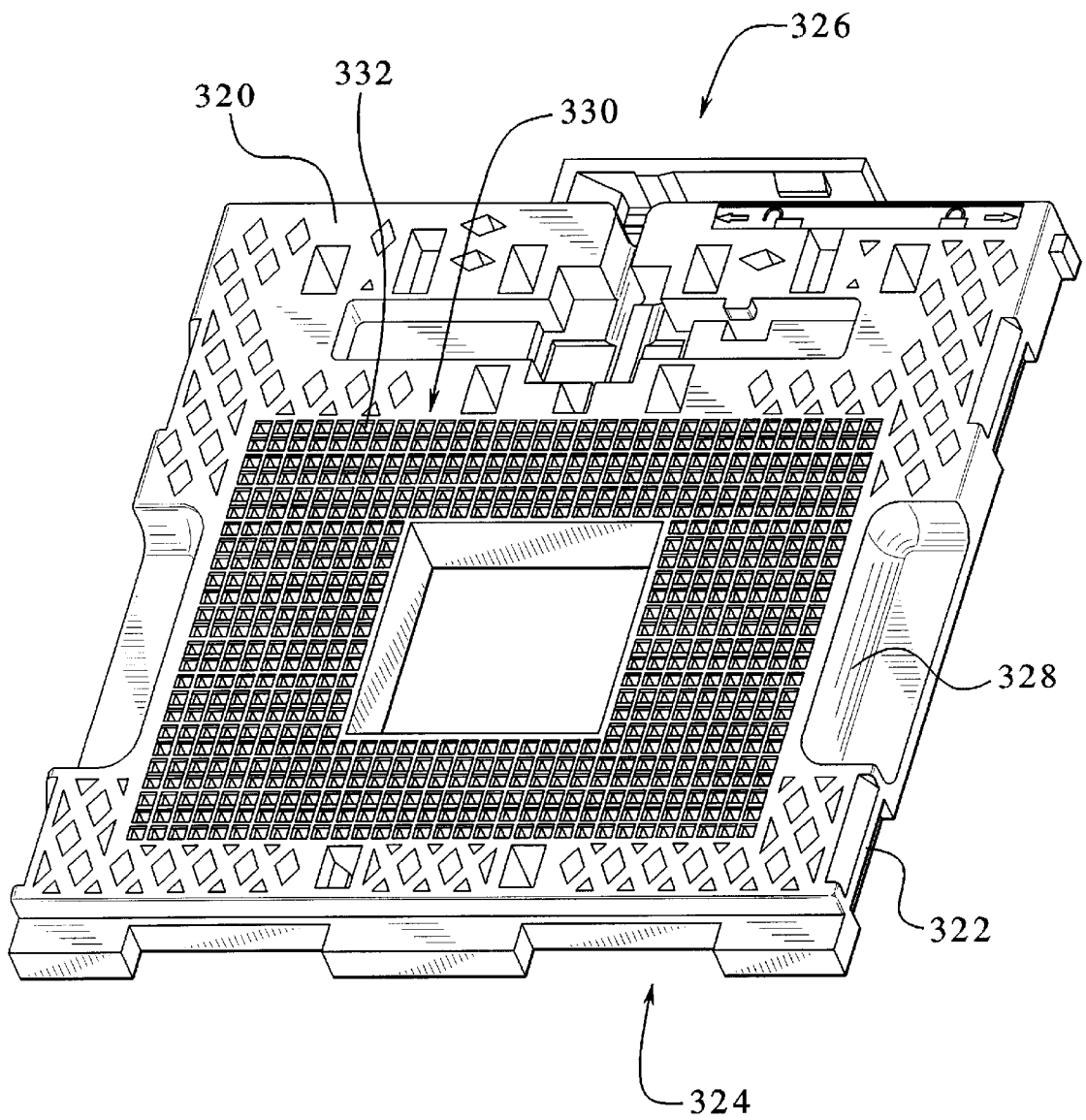
FIG. 15 illustrates a perspective view of a base housing formed in accordance with an embodiment of the present invention for the PGA assemblies of FIGS. 13–14.

FIG. 15 illustrates the base housing 310. The base housing 310 comprises an array of pin receiving chambers 330 comprising pin receiving chambers 332, a top surface 320, base side walls 322, a front end 324, a back end 326, and socket alignment notches 328. The array of pin receiving chambers 330 is located on the top surface 320, and is configured to accept the pin array of an electronic package. The socket alignment notches 328 cooperate with the cover alignment notches 358 of the cover 312 to form the socket alignment notches 316 which facilitate alignment of the first electronic package 304 as well as the removal of the first electronic package 304. The base side walls 322 are adapted to slidably engage corresponding side walls of the cover 312. The lever 314 is mounted to the base housing 310 proximal to the back end 326 of the base housing 310. When the lever 314 is moved from the open position to the closed position, the cover 312 slides on the base housing 310 away from the back end 326 and toward the front end 324 of the base housing 310.

Figure 16:
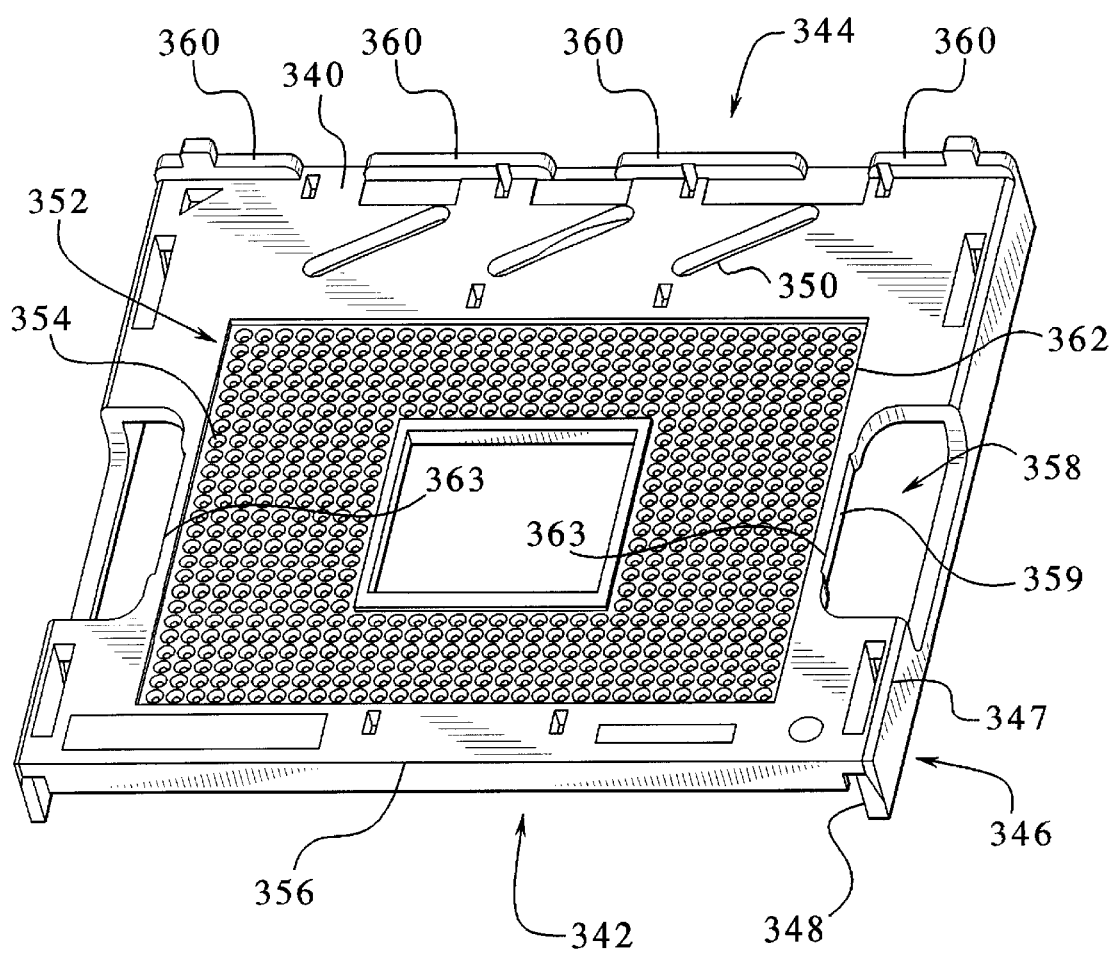
FIG. 16 illustrates a perspective view of a cover formed in accordance with an embodiment of the present invention for the PGA assemblies of FIGS. 13–14.

FIG. 16 illustrates the cover 312. The cover 312 comprises a top surface 340, a front end 342, a back end 344, sides 346, cover side walls 348, slots 350, a package receiving area 362, a hole array 352, a rail 360, a front edge 356, and cover alignment notches 358. The sides 346 meet the top surface 340 at the lateral edges 347, which are spaced at a width substantially the same as the width of the second electronic package 306. The cover side walls 348 are configured to slidably engage the base side walls 322. The slots 350 are configured to accept an actuating mechanism (not shown) responsive to the lever 314 used to slidably position the cover 312 along the length of the base housing 310.

The package receiving area 362 is located on the top surface 340 of the cover 312, and is adapted to accept the footprint of electronic packages. The hole array 352 corresponds to the array of pin receiving chambers 330 of the base housing 310 and is configured to accept the pins of electronic packages. The hole array 352 comprises holes 354 which feature a counterbore tapered such that the diameter of the holes 354 is greatest proximal to the top surface 340 of the cover 312.

The cover 312 also comprises a rail 360 located proximal to the back end 344. The rail 360 extends above the top surface 340. The rail 360 is located and configured to align and engage the second electronic package 306 during the mating of the second electronic package 306 and the socket 302.

The top surface 340 terminates at the front edge 356 toward the front end 342 of the cover 312. The front edge 356 is located at a distance from the hole array 352 corresponding to the distance of a front edge of the first electronic package 304 from the pin array 380 to allow for visual longitudinal alignment of the first electronic package 304 during mating of the first electronic package 304 to the socket 302.

The cover 312 also comprises cover alignment notches 358. The cover alignment notches 358 are cut through the top surface 340 and the sides 346. The cover alignment notches 358 cooperate with the base alignment notches 328 to form the socket alignment notch 316. Each cover alignment notch 358 comprises an alignment edge 359 located at the farthest penetration of the cover alignment notch 358 across the width of the top surface 340. The cover alignment notches 358 are located so that the width 363 across the top surface 340 of the cover 312 between the alignment edges 359 corresponds to the width across the first electronic package 304. This allows the alignment edges 359 to provide visual lateral alignment of the first electronic package 304 during mating of the first electronic package 304 to the socket 302. The socket alignment notches 316 also provide access for fingertips during removal of the first electronic package 304.

Referring to FIGS. 13–14, different electronic packages having similar pin arrays may be mated to the socket 302 as will now be described. In FIG. 13, the first electronic package 304 is shown mated to the socket 302. In FIG. 14, the second electronic package 306 is shown mated to the socket 302.

The lever 314 is in the open position before mating the first electronic package 304 to the socket 302. To assure that the first electronic package 304 is properly aligned with the hole array 352 of the cover 312, the front edge 356 and alignment edges 359 of the cover 312 are used. The front edge 356 of the cover is located such that the pin array 380 of the first electronic package 304 will be in proper longitudinal alignment with the hole array 352 when the front edge 370 of the first electronic package 304 is in line with the front edge 356 of the cover 312. The width 363 between the alignment edges 359 of the cover 312 is sized to align the first electronic package 304 so that the pin array 380 is in proper lateral alignment with the hole array 352. To align the first electronic package 304 longitudinally with the cover 312, the front edge 370 of the first electronic package 304 is lined up with the front edge 356 of the cover 312. The first electronic package 304 is aligned laterally by lining up the sides 374 of the first electronic package 304 with the alignment edges 359. The first electronic package 304, thus aligned, is lowered until the bottom surface of the first electronic package is abutted against the top surface 340 of the cover 312 and the pins 382 have been accepted by the holes 354.

The lever 314 is then moved from the open position to the closed position, moving the cover 312 to move toward the front end 324 of the base housing 310. The pins 382 of the first electronic package 304 move into full electrical contact with the pin receiving chambers 332 of the base housing 310 when the lever 314 has reached the closed position. FIG. 13 illustrates the PGA assembly 300 with the lever 314 in the closed position and the first electronic package 304 mated to the socket 302. To remove the first electronic package 304, the lever 314 is moved to the open position. The first electronic package 304 is then removed by hand, with the socket alignment notches 316 providing access for fingertips.

The front edge 356 of the cover 312 provides visual alignment in the longitudinal direction, and the alignment edges 359 provide visual alignment in the lateral direction for accurately locating the first electronic package 304 during mating to the socket 302. This assures quick and accurate placement of the first electronic package 304, thereby reducing assembly time and effort as well as protecting the components from damage caused by misalignment during mating. Shortening the length of the cover 312 to provide the front edge 356 for longitudinal alignment of the first electronic package 304 results in a socket 302 that takes up less space on a circuit board. The components of the socket 302 utilizing edges to align the first electronic package 304 are also easy and inexpensive to mold and manufacture.

The procedures for mating and removal for the second electronic package 306 and the socket 302 are similar to those for the earlier described embodiments. The second electronic package 306 is laterally aligned visually with the sides 390 aligned with the lateral edges 347 of the cover 312, and is longitudinally aligned by tilting, back edge 388 down, into abutment against the rail 360. Once the second electronic package 306 is fully mounted to the cover 312, the lever 314 is moved to the closed position, bringing the pins 398 into full electrical contact with the pin receiving chambers 332 of the base housing 310. To remove the second electronic package 306, the lever 314 is moved to the open position. The second electronic package 306 is then removed by hand by grasping the sides 390 of the second electronic package 306 that are substantially flush with the lateral edges of the top surface 340 of the cover 312.

The rail 360 provides a positive mechanical stop in the longitudinal direction, and the top surface 340 provides visual alignment in the lateral direction for accurately locating the second electronic package 306 during mating to the socket 302. Thus, electronic packages of differing sizes may be mated to the socket 302.

While particular elements, embodiments and applications of the present invention have been shown and described, it will be understood, of course, that the invention is not limited thereto since modifications may be made by those skilled in the art, particularly in light of the foregoing teachings. It is therefore contemplated by the appended claims to cover such modifications as incorporate those features which come within the spirit and scope of the invention.

What is claimed is:

1. A socket for receiving electronic packages having different first and second sizes, comprising:
    a base housing having a top surface and base side walls, said top surface including an array of pin receiving chambers therein;
    a cover having a top surface including an array of holes therethrough corresponding to said array of pin receiving chambers, said cover including cover side walls connected to said top surface, said cover and base side walls slidably engaging one another; and
    first and second locating members provided on at least one of said base housing and cover, said first locating member being positioned to engage and align an electronic package having a first size with said array of holes in said cover, said second locating member being positioned to engage and align an electronic package of a second size with said array of holes in said cover.

2. The socket of claim 1 wherein said first and second locating members provide a mechanical stop adapted for locating electronic packages in at least one of a lateral and a longitudinal direction with respect to said cover during installation of electronic packages in said socket.

3. The socket of claim 1 wherein one of said first and second locating members extends above said top surface of said cover and another of said first and second locating members is recessed beneath said top surface of said cover.

4. The socket of claim 1 wherein said first locating member is adapted to engage and align an electronic package in both a longitudinal and a lateral direction.

5. The socket of claim 1 wherein one of said first and second locating members is provided on said base housing and another of said first and second locating members is provided on said cover.

6. The socket of claim 1 wherein at least one of said first and second locating members is adapted to engage and align an electronic package in both a longitudinal and a lateral direction.

7. The socket of claim 1 wherein at least one of said first and second locating members is adapted to engage and align an electronic package during mounting to said socket and disengages an electronic package after mounting to said socket.

8. The socket of claim 1, wherein at least one of said first and second locating members is adapted for visual alignment of an electronic package.

9. The socket of claim 1, wherein at least one of said first and second locating members is adapted for visual alignment of an electronic package and is common to said base housing and said cover.

10. The socket of claim 1, wherein at least one of said first and second locating members is a resiliently flexible locating member, said resiliently flexible locating member comprising a flexing portion affixed to said socket, said resiliently flexible locating member adapted to engage and align an electronic package having a first size with said array of holes in said cover and to be deflected beneath said top surface of said cover when an electronic package having a second size is mounted to said socket.

11. The socket of claim 1 wherein said cover comprises relieved portions from said top surface adapted for removing an electronic package.

12. An electrical system comprising:
    first and second electronic packages of different sizes having corresponding arrays of pins; and
    a socket configured to receive said first and seconds electronic packages, said socket comprising a base having a top surface including an array of pin receiving chambers therein corresponding to said arrays of pins, said base having base side walls; and a cover having a top surface including an array of holes therethrough corresponding to said array of pin receiving chambers and said arrays of pins, said cover including cover side walls connected to said top surface, said cover and base side walls slidably engaging one another whereby said array of pins may be slid into and out of engagement with said array of pin receiving chambers, said socket further comprising first and second aligning surfaces provided on at least one of said base and cover, said first aligning surface being positioned to engage align said electronic package with said array of holes in said cover, said second aligning surface being positioned to engage and align an electronic package having a different size than said electronic package with said array of holes in said cover.

13. The electrical system of claim 12 wherein said first and second aligning surfaces provide a mechanical stop adapted for locating one of said first and second electronic packages in at least one of a lateral and a longitudinal direction with respect to said cover during installation of electronic packages in said socket.

14. The electrical system of claim 12 wherein said first and second aligning surfaces are provided on said cover, one of said first and second aligning surfaces extending above said top surface of said cover and another of said first and second aligning surfaces extending beneath said top surface of said cover.

15. The electrical system of claim 14 wherein said aligning surface extending beneath said top surface of said cover is adapted to engage and align one of said first and second electronic packages in both a longitudinal and a lateral direction.

16. The electrical system of claim 12 wherein one of said first and second aligning surfaces is provided on said base and another of said first and second aligning surfaces is provided on said cover.

17. The electrical system of claim 12 wherein at least one of said first and second aligning surfaces is adapted to engage and align one of said first and second electronic packages during mounting to said socket and disengages one of said first and second electronic packages after mounting to said socket.

18. The electrical system of claim 12 wherein at least one of said first and second aligning surfaces is adapted for visual alignment of one of said first and second electronic packages.

19. The electrical system of claim 12 wherein at least one of said first and second aligning surfaces is adapted for visual alignment of one of said first and second electronic packages and is common to said base housing and said cover.

20. The electrical system of claim 12 wherein at least one of said first and second aligning surfaces is adapted for visual alignment of one of said first and second electronic packages and is adapted to facilitate removal of one of said first and second electronic packages.

21. The electrical system of claim 12 wherein said cover comprises relieved portions from said top surface adapted for removing one of said first and second electronic packages.

22. A socket for receiving electronic packages having first and second different sizes, comprising:
- a base housing having a top surface and base side walls, said top surface including an array of pin receiving chambers therein;
- a cover having a top surface including an array of holes therethrough corresponding to said array of pin receiving chambers, said cover including cover side walls connected to said top surface, said cover and base side walls slidably engaging one another; and
- a first locating member provided on said base housing, said first locating member being positioned to engage and align an electronic package having a first size with said array of holes in said cover.

23. The socket of claim 22 further comprising a second locating member provided on said cover, said second locating member being positioned to engage and align an electronic package having a second size greater than said first size with said array of holes in said cover.

24. The socket of claim 23 wherein said first locating member extends above said top surface of said base housing and said second locating member extends above said top surface of said cover.

25. The socket of claim 22 wherein said first locating member is adapted to engage and align an electronic package in both a longitudinal and a lateral direction with respect to said cover.

26. The socket of claim 22 wherein said first locating member is adapted to engage and align an electronic package during mounting to said socket and disengages an electronic package after mounting to said socket.

\* \* \* \* \*